(12) United States Patent
Printz

(10) Patent No.: US 7,729,910 B2
(45) Date of Patent: Jun. 1, 2010

(54) ZERO-SEARCH, ZERO-MEMORY VECTOR QUANTIZATION

(75) Inventor: Harry Printz, New York, NY (US)

(73) Assignee: Agiletv Corporation, Menlo Park, CA (US)

( * ) Notice: Subject to any disclaimer, the term of this patent is extended or adjusted under 35 U.S.C. 154(b) by 1105 days.

(21) Appl. No.: 10/877,520

(22) Filed: Jun. 25, 2004

(65) Prior Publication Data
US 2005/0004795 A1    Jan. 6, 2005

Related U.S. Application Data

(60) Provisional application No. 60/483,268, filed on Jun. 26, 2003.

(51) Int. Cl.
*G10L 15/00* (2006.01)
(52) U.S. Cl. ..................................... 704/236
(58) Field of Classification Search ................. 704/236
See application file for complete search history.

(56) References Cited

U.S. PATENT DOCUMENTS

| 6,008,387 | A  | 12/1999 | Ramaswamy et al. |
| 6,012,058 | A  | 1/2000  | Fayyad et al. |
| 6,141,640 | A  | 10/2000 | Moo |
| 6,320,947 | B1 | 11/2001 | Joyce |
| 6,374,177 | B1 | 4/2002  | Lee |
| 6,381,316 | B2 | 4/2002  | Joyce |
| 6,658,414 | B2 | 12/2003 | Bryan |
| 6,711,543 | B2 | 3/2004  | Cameron |
| 6,714,632 | B2 | 3/2004  | Joyce |
| 6,721,633 | B2 | 4/2004  | Funk |

(Continued)

FOREIGN PATENT DOCUMENTS

EP    1341363    9/2003

(Continued)

OTHER PUBLICATIONS

Xiaolin Wu, Optimal Binary Vector Quantization via Enumeration of Covering Codes, Mar. 1997, IEEE. vol. 43, p. 638-645.*

(Continued)

*Primary Examiner*—David R Hudspeth
*Assistant Examiner*—Jakieda R Jackson
(74) *Attorney, Agent, or Firm*—Michael A. Glenn; Glenn Patent Group

(57) ABSTRACT

The invention comprises a method for lossy data compression, akin to vector quantization, in which there is no explicit codebook and no search, i.e. the codebook memory and associated search computation are eliminated. Some memory and computation are still required, but these are dramatically reduced, compared to systems that do not exploit this method. For this reason, both the memory and computation requirements of the method are exponentially smaller than comparable methods that do not exploit the invention. Because there is no explicit codebook to be stored or searched, no such codebook need be generated either. This makes the method well suited to adaptive coding schemes, where the compression system adapts to the statistics of the data presented for processing: both the complexity of the algorithm executed for adaptation, and the amount of data transmitted to synchronize the sender and receiver, are exponentially smaller than comparable existing methods.

37 Claims, 35 Drawing Sheets

1. Begin with a fixed number $K$, which is the desired number of hypercubes, and a transformed example data set $\mathcal{U}$. Map each element $u \in \mathcal{U}$, where $u = \langle u_1, \ldots, u_D \rangle$, to the positive orthant $\mathsf{P}^D$, via the map $p : \langle u_1, \ldots, u_D \rangle \mapsto \langle |u_1|, \ldots, |u_D| \rangle$, yielding the set $\mathcal{U}^+ = \{p(u) \mid u \in \mathcal{U}\}$.

2. Select an initial set of $K$ radius vectors $A^{(0)} = \{\bar{a}_0^{(0)}, \ldots, \bar{a}_{K-1}^{(0)}\}$, by any desired method. A typical selection method is to choose $K$ points randomly from $\mathcal{U}^+$.

3. Set the iteration count $i$ to 0.

4. Establish a termination condition $\tau$. This condition typically depends upon one or more of: the number of iterations executed, the closeness of match between the current radius vector collection $A^{(i)}$ and $\mathcal{U}^+$, the improvement of some statistic over the previous iteration, or some other consideration. To exhibit this dependence explicitly, we write $\tau(i, A^{(i)}, \mathcal{U}^+)$.

5. Test $\tau(i, A^{(i)}, \mathcal{U}^+)$. If the termination condition is satisfied, return $A^{(i)}$ as the desired radius vector collection and stop.

6. If the termination condition is not satisfied, compute a new radius vector collection $A^{(i+1)}$ as follows.

(a) Partition $\mathcal{U}^+$ into $K$ sets $S_0, \ldots, S_{K-1}$, where
   $$S_j = \{v \in \mathcal{U}^+ \mid \operatorname*{argmin}_k \|v - \bar{a}_k^{(i)}\| = j\}$$
   Thus $S_j$ consists of all the vectors $v$ in $\mathcal{U}^+$ that are closer to $\bar{a}_j^{(i)}$ than any other element of $A^{(i)}$.

(b) Set $\bar{a}_j^{(i+1)}$, the $j$th entry of the new radius vector collection $A^{(i+1)}$, to the mean of the vectors in $S_j$. In symbols,
   $$\bar{a}_j^{(i+1)} = \frac{1}{|S_j|} \sum_{v \in S_j} v.$$

(c) Set $A^{(i+1)} = \{\bar{a}_0^{(i+1)}, \ldots, \bar{a}_{K-1}^{(i+1)}\}$.

7. Increment the iteration count $i$, and go back to step 5.

U.S. PATENT DOCUMENTS

| | | |
|---|---|---|
| 6,725,022 B1 | 4/2004 | Clayton |
| 6,728,531 B1 | 4/2004 | Lee |
| 6,799,201 B1 | 9/2004 | Lee |
| 6,892,083 B2 | 5/2005 | Shostak |
| 7,027,987 B1 | 4/2006 | Franz et al. |
| 7,113,981 B2 | 9/2006 | Slate |
| 2001/0019604 A1 | 9/2001 | Joyce |
| 2002/0015480 A1 | 2/2002 | Daswani |
| 2002/0049535 A1 | 4/2002 | Rigo |
| 2002/0106065 A1 | 8/2002 | Joyce |
| 2002/0146015 A1 | 10/2002 | Bryan |
| 2003/0028380 A1 | 2/2003 | Freeland |
| 2003/0033152 A1 | 2/2003 | Cameron |
| 2003/0065427 A1 | 4/2003 | Funk |
| 2003/0068154 A1 | 4/2003 | Zylka |
| 2003/0073434 A1 | 4/2003 | Shostak |
| 2003/0212702 A1* | 11/2003 | Campos et al. ............ 707/102 |
| 2004/0077334 A1 | 4/2004 | Joyce |
| 2004/0110472 A1 | 6/2004 | Witkowski |
| 2004/0127241 A1 | 7/2004 | Shostak |
| 2004/0132433 A1 | 7/2004 | Stern |
| 2005/0143139 A1 | 6/2005 | Park |
| 2005/0144251 A1 | 6/2005 | Slate |
| 2005/0170863 A1 | 8/2005 | Shostak |
| 2006/0018440 A1 | 1/2006 | Watkins |
| 2006/0050686 A1 | 3/2006 | Velez-Rivera |
| 2006/0085521 A1 | 4/2006 | Sztybei |
| 2006/0206339 A1 | 9/2006 | Silvera |
| 2006/0206340 A1 | 9/2006 | Silvera |

FOREIGN PATENT DOCUMENTS

| | | |
|---|---|---|
| EP | 1003018 | 5/2005 |
| EP | 1633150 | 3/2006 |
| EP | 1633151 | 3/2006 |
| EP | 1742437 | 1/2007 |
| WO | WO00/16568 | 3/2000 |
| WO | WO00/21232 | 4/2000 |
| WO | WO01/22112 | 3/2001 |
| WO | WO01/22249 | 3/2001 |
| WO | WO01/22633 | 3/2001 |
| WO | WO01/22712 | 3/2001 |
| WO | WO01/22713 | 3/2001 |
| WO | WO01/39178 | 5/2001 |
| WO | WO01/57851 | 8/2001 |
| WO | WO02/07050 | 1/2002 |
| WO | WO02/11120 | 2/2002 |
| WO | WO02/17090 | 2/2002 |
| WO | WO02/097590 | 12/2002 |
| WO | WO2004/021149 | 3/2004 |
| WO | WO2004/077721 | 9/2004 |
| WO | WO2005/079254 | 9/2005 |
| WO | WO2006/029269 | 3/2006 |
| WO | WO2006/033841 | 3/2006 |
| WO | WO2006/098789 | 9/2006 |

OTHER PUBLICATIONS

Salami, R. et al.; "A Fully Vector Quantised Self-Excited Vocoder"; May 23, 2989; International Conference on Acoustics, Speech & Signal Processing, NY, IEEE, vol. 1, Conf. 14, pp. 124-127, par. 3.1.

Hanzo, L. et al.; Voice Compression and Communications - Principles and Applications for Fixed and Wireless Channels; 2001; Wiley, XP002408246, ISBN: 0-471-15039-8, par. 4.3.3.

Belzer, Benjamin et al.; "Symmetric Trellis-Coded Vector Quantization"; Nov. 1997; IEEE Transaction on Communications, vol. 45, No. 11, pp. 1354-1357, par. II, figure 2.

Chent, Tung-Shou et al.; "Diagonal Axes Method (DAM): A Fast Search Algorithm for Vector Quantization"; Jun. 1997; IEEE Transactions on Circuits and Systems for Video Technology; vol. 7, No. 3, par. I, II.

Chan, C-F et al.;"Efficient codebook search procedure for vector-sum excited linear predictive coding of speech"; Oct. 27, 1994; Electronics Letters, IEE Stevenage, GB, vol. 30, No. 22, pp. 1830-1831.

Chan, Cheung-Fat; "Fast stochastic codebook search through the use of odd-symmetric crosscorrelation basis vectors"; May 9, 1995; Acoustics, Speech, and Signal Processing, ICASSP-95; vol. 1, pp. 21-24.

* cited by examiner

1. Begin with a fixed number $K$, which is the desired number of codebook entries, and an example data set $\mathcal{E}$.

2. Select an initial codebook $C^{(0)} = \{c_0^{(0)}, \ldots, c_{K-1}^{(0)}\}$, by any desired method. A typical selection method is to choose $K$ points randomly from $\mathcal{E}$.

3. Set the iteration count $i$ to 0.

4. Establish a termination condition $\tau$. This condition typically depends upon one or more of: the number of iterations executed, the closeness of match between the current codebook $C^{(i)}$ and $\mathcal{E}$, the improvement of some statistic over the previous iteration, or some other consideration. To exhibit this dependence explicitly, we write $\tau(i, C^{(i)}, \mathcal{E})$.

5. Test $\tau(i, C^{(i)}, \mathcal{E})$. If the termination condition is satisfied, return $C^{(i)}$ as the codebook and stop.

6. If the termination condition is not satisfied, compute a new codebook $C^{(i+1)}$ as follows.

(a) Partition $\mathcal{E}$ into $K$ sets $S_0, \ldots, S_{K-1}$, where
    $$S_j = \{v \in \mathcal{E} \mid g^{C^{(i)}}(v) = j\}.$$
    Thus $S_j$ consists of all the vectors $v$ in $\mathcal{E}$ that are encoded as index $j$ with respect to the current codebook $C^{(i)}$.

(b) Set $c_j^{(i+1)}$, the $j$th entry of the new codebook $C^{(i+1)}$, to the mean of the vectors in $S_j$. In symbols,
    $$c_j^{(i+1)} = \frac{1}{|S_j|} \sum_{v \in S_j} v.$$

(c) Set $C^{(i+1)} = \{c_0^{(i+1)}, \ldots, c_{K-1}^{(i+1)}\}$.

7. Increment the iteration count $i$, and go back to step 5.

*Figure 2*

1. Obtain vector $v$ for compression.
2. Compute $u = Tv$. Let $u$ be denoted $\langle u_1, \ldots, u_D \rangle$.
3. Form the $D$-bit binary number $i$ as the bitwise concatenation $$i = m(u_D)\, m(u_{D-1}) \cdots m(u_2)\, m(u_1). \tag{35}$$

Note that the $j$th bit of $i$ is 0 if $u_j$ is zero or positive, and 1 if it is negative.

4. Transmit $i$.

*Figure 11*

1. Obtain index $i$ for decompression.
2. Set
$$\tilde{u}_1 = b_0(i, \alpha_1) \qquad (36)$$
$$\tilde{u}_2 = b_1(i, \alpha_2) \qquad (37)$$
$$\vdots$$
$$\tilde{u}_D = b_{D-1}(i, \alpha_D) \qquad (38)$$

Thus each $\tilde{u}_j$ is either $+\alpha_j$ or $-\alpha_j$, depending as the $j$th bit of $i$ is 0 or 1.

3. Compute $\tilde{v} = T^{-1}\tilde{u}$.
4. Return $\tilde{v}$.

*Figure 12*

1. Obtain vector $v$ for compression.

2. Compute $u = Tv$. Let $u$ be denoted $\langle u_1, \ldots, u_D \rangle$.

3. Form $\bar{\zeta}(u) = \langle \zeta(u_1), \ldots, \zeta(u_D) \rangle$.

4. Find $k = \text{argmin}_j \|u - \bar{\alpha}^j \odot \bar{\zeta}(u)\|$, where $\bar{\alpha}^j$ is drawn from $A = \{\bar{\alpha}^1, \bar{\alpha}^2, \ldots, \bar{\alpha}^K\}$, a set of hypercube radius vectors. This requires no more than $K$ distance computations. Note that $\bar{\alpha}^j \odot \bar{\zeta}(u)$ is the element of $\mathcal{K}(\bar{\alpha}^j)$ that lies in the same orthant as $u$, and hence that $k$ is the index of the hypercube codebook that has a vertex that is closest to $u$.

5. Form the $D$-bit binary number $i$ as the bitwise concatenation $$i = m(u_D)\, m(u_{D-1}) \cdots m(u_2)\, m(u_1). \qquad (50)$$

Note that the $j$th bit of $i$ is 0 if $u_j$ is zero or positive, and 1 if it is negative.

6. Transmit the pair $\langle k-1, i \rangle$. Since $0 \leq k-1 < K$, this requires no more than $\lceil \log_2 K \rceil + D$ bits.

Figure 18

1. Obtain the pair $\langle k-1, i \rangle$ for decompression.

2. Select $\bar{\alpha}^k = \langle \alpha_1^k, \ldots, \alpha_D^k \rangle$ from the set $A = \{\bar{\alpha}^1, \bar{\alpha}^2, \ldots, \bar{\alpha}^K\}$ of hypercube radius vectors.

3. Set $$\tilde{u}_1 = b_0(i, \alpha_1^k) \qquad (51)$$
$$\tilde{u}_2 = b_1(i, \alpha_2^k) \qquad (52)$$
$$\vdots$$
$$\tilde{u}_D = b_{D-1}(i, \alpha_D^k) \qquad (53)$$

Thus each $\tilde{u}_j$ is either $+\alpha_j^k$ or $-\alpha_j^k$, depending as the $j$th bit of $i$ is 0 or 1.

4. Compute $\tilde{v} = T^{-1}\tilde{u}$.

5. Return $\tilde{v}$.

Figure 19

1. Begin with a fixed number $K$, which is the desired number of hypercubes, and a transformed example data set $\mathcal{U}$. Map each element $u \in \mathcal{U}$, where $u = \langle u_1, \ldots, u_D \rangle$, to the positive orthant $\mathbf{P}^D$, via the map $p : \langle u_1, \ldots, u_D \rangle \mapsto \langle |u_1|, \ldots, |u_D| \rangle$, yielding the set $\mathcal{U}^+ = \{p(u) \mid u \in \mathcal{U}\}$.

2. Select an initial set of $K$ radius vectors $A^{(0)} = \{\bar{\alpha}_0^{(0)}, \ldots, \bar{\alpha}_{K-1}^{(0)}\}$, by any desired method. A typical selection method is to choose $K$ points randomly from $\mathcal{U}^+$.

3. Set the iteration count $i$ to 0.

4. Establish a termination condition $\tau$. This condition typically depends upon one or more of: the number of iterations executed, the closeness of match between the current radius vector collection $A^{(i)}$ and $\mathcal{U}^+$, the improvement of some statistic over the previous iteration, or some other consideration. To exhibit this dependence explicitly, we write $\tau(i, A^{(i)}, \mathcal{U}^+)$.

5. Test $\tau(i, A^{(i)}, \mathcal{U}^+)$. If the termination condition is satisfied, return $A^{(i)}$ as the desired radius vector collection and stop.

6. If the termination condition is not satisfied, compute a new radius vector collection $A^{(i+1)}$ as follows.

(a) Partition $\mathcal{U}^+$ into $K$ sets $S_0, \ldots, S_{K-1}$, where
    $$S_j = \{v \in \mathcal{U}^+ \mid \operatorname*{argmin}_k \|v - \bar{\alpha}_k^{(i)}\| = j\}$$
    Thus $S_j$ consists of all the vectors $v$ in $\mathcal{U}^+$ that are closer to $\bar{\alpha}_j^{(i)}$ than any other element of $A^{(i)}$.

(b) Set $\bar{\alpha}_j^{(i+1)}$, the $j$th entry of the new radius vector collection $A^{(i+1)}$, to the mean of the vectors in $S_j$. In symbols,
    $$\bar{\alpha}_j^{(i+1)} = \frac{1}{|S_j|} \sum_{v \in S_j} v.$$

(c) Set $A^{(i+1)} = \{\bar{\alpha}_0^{(i+1)}, \ldots, \bar{\alpha}_{K-1}^{(i+1)}\}$.

7. Increment the iteration count $i$, and go back to step 5.

Figure 23

ZERO-SEARCH, ZERO-MEMORY VECTOR QUANTIZATION

CROSS-REFERENCE TO RELATED APPLICATIONS

This application claims priority and incorporates by reference the provisional patent application entitled "Improvements in Voice Control of Media Delivery System," Application No. 60/483,268, filed on Jun. 26, 2003.

BACKGROUND OF THE INVENTION

1. Technical Field

The invention relates to data compression. More particularly, the invention relates to a novel data compression technique referred to as zero-search, zero-memory vector quantization.

2. Description of the Prior Art

The subject of this invention is a new technique for data compression, referred to herein as zero-search, zero-memory vector quantization. Vector quantization is a well-known and widely practiced method of lossy data compression. By "data compression" is meant that some body of data, typically a sequence of vectors of some fixed dimension, and requiring some amount of memory (for storage) or communication bandwidth (for transmission), is converted into a smaller amount of data. From this converted representation, usually referred to as the compressed form of the data, a reasonable facsimile of the original body of data may be reconstructed, via an appropriate decompression algorithm. Because data reconstructed by this method may not exactly match the original, the scheme is said to be lossy. By contrast, a compression scheme with the property that the original data may always be exactly reconstructed from its compressed representation is said to be lossless.

Vector quantization operates by establishing a small set of vectors, called a codebook, which are representative of those that will be processed by the deployed system. When a vector is presented for compression, a computation determines the codebook entry that is closest to it, and the index of this entry within the codebook, rather than the vector itself, is transmitted (or stored) as a proxy of the input. Upon receipt (or readback) of index i, the input data are reconstructed by extracting the i th entry from the codebook, and presenting this vector as a facsimile of the original. Though it can achieve very high rates of compression, two significant drawbacks of this method are:

(1) The need to store the codebook (if the system is being used for data transmission, this must be done at both the sender and the receiver), and
(2) The need for the sender to search the codebook, to find the closest match to the input vector.

SUMMARY OF THE INVENTION

In this document we disclose a method for data compression, akin to but different from the existing vector quantization technique, that removes these drawbacks. There is no explicit codebook and no search; the codebook memory and associated search computation are eliminated. Some memory and computation are still required, but these are dramatically reduced, compared to systems that do not exploit this method. The method has been validated in a demanding, real-world data compression task, and found to yield over a 30-fold reduction in computation, and over a 300-fold reduction in memory (compared with a system that does not exploit the invention), while maintaining good fidelity of reconstruction. The invention teaches a variety of algorithms for compression; these are all exponentially more efficient, in both computation time and use of memory, than methods that do not exploit the invention.

Because there is no explicit codebook to be stored or searched, no such codebook need be generated either. This makes the method well suited to adaptive coding schemes, where the compression system adapts to the statistics of the data presented for processing. Both the complexity of the algorithm executed for adaptation, and the amount of data transmitted to synchronize the sender and receiver, are exponentially more efficient than existing methods.

BRIEF DESCRIPTION OF THE DRAWINGS

FIG. 1a shows 200 two-dimensional vectors plotted, each marked by a dot, and seen to fall naturally into eight clusters, and FIG. 1b shows the same data plotted, along with nominal cluster centers, each marked by a star;

FIG. 2 shows the conventional K-means algorithm, which is a widely used algorithm for determining vector quantization codebooks;

FIG. 10a shows data before applying the transform (E, 1000 points distributed within an ellipse); and FIG. 10b shows data after applying the transform (TE, same 1000 points, transformed by T);

FIG. 11 shows an algorithm to compress a vector v;

FIG. 12 shows an algorithm to decompress an index i;

FIG. 13a shows an original data set E (1000 data points randomly distributed between two unaligned, overlapping ellipses); and FIG. 13b shows a "symmetrized" data set, TE, and depicting $\kappa(\overline{\alpha})$;

FIG. 15a shows rotation of $\kappa(\overline{\alpha})$, for $\overline{\alpha}=<0.8431,0.8041>$, through an angle $\theta^*=0.2827$ (the optimal rotation); and FIG. 15b shows equivalent rotation of data, through an angle $-\theta^*$;

FIG. 18 shows an algorithm to compress a vector v by a multiple hypercube method;

FIG. 19 shows an algorithm to decompress a hypercube, index pair <k−1,i>;

FIG. 20a shows transformed example data U, and FIG. 20B shows a result of the K-means algorithm, for K=8;

FIG. 21a shows folded example data, $U^+=p[U]$, and FIG. 21b shows the result of the orthant K-means algorithm, for K=2 (the markers correspond to the $\alpha$ vectors of the desired K hypercubes);

FIG. 22a shows code points from conventional K-means, and FIG. 22b shows code points from orthant K-means; and FIG. 23 shows the orthant K-means algorithm.

DETAILED DESCRIPTION OF THE INVENTION

Figure 1A:
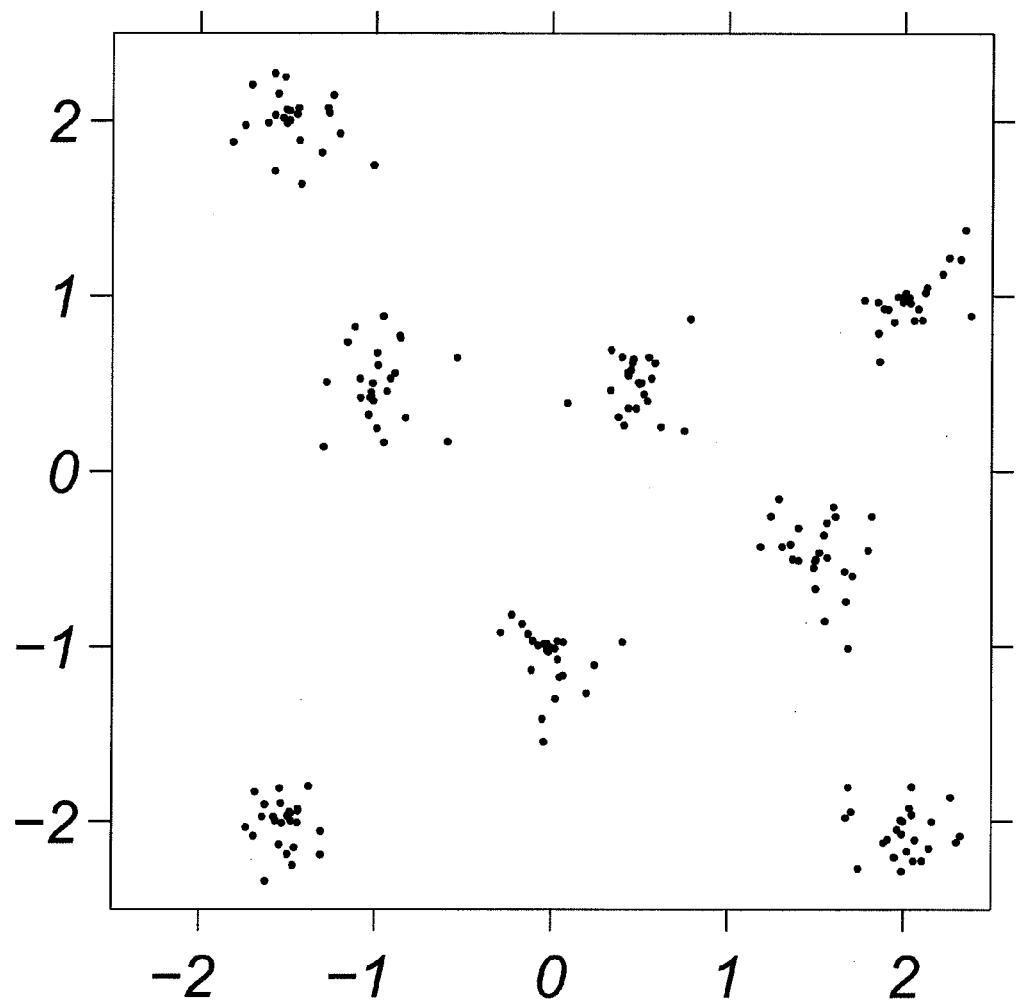
FIGS. 1a and 1b show data for compression, where

In this document we disclose a method for implementing zero-search, zero-memory vector quantization. There is no explicit codebook and no search; the codebook memory and associated search computation are eliminated. Some memory and computation are still required, but these are dramatically reduced, compared to systems that do not exploit this method. The method has been validated in a demanding, real-world data compression task, and found to yield over a 30-fold reduction in computation, and over a 300-fold reduction in memory (compared with a system that does not exploit the invention), while maintaining good fidelity of reconstruction.

Because there is no explicit codebook to be stored or searched, no such codebook need be generated either. This makes the method well suited to adaptive coding schemes, where the compression system adapts to the statistics of the data presented for processing. Both the complexity of the algorithm executed for adaptation, and the amount of data transmitted to synchronize the sender and receiver, are exponentially more efficient than existing methods. Vector quantization is described in detail in Allen Gersho and Robert M. Gray, *Vector Quantization and Signal Compression*, Kluwer Academic Publishers, 1992, and the reader is urged to consult that book for a thorough treatment of the subject. Nevertheless, for completeness this document provides enough background for the reader to understand the operation of our invention, its benefits, and how it differs from current methods. The reader is assumed to have a basic knowledge of linear algebra and multivariate statistics, notably the concepts of eigenvectors and covariance, at the levels of references Howard Anton, *Elementary Linear Algebra*, John Wiley and Sons, 1973 and Paul G. Hoel, *Introduction to Mathematical Statistics*, John Wiley and Sons, New York, N.Y., 5$^{th}$ edition, 1984, respectively. Understanding certain of the extensions to the basic method requires some familiarity with the Lie theory of continuous groups, at the level of Morton L. Curtis, *Matrix Groups*. Springer-Verlag, New York, N.Y., second edition, 1984.

The material presented here will be framed in terms of the compression of digitized human speech, which is transmitted through a communication channel, and then processed by an automatic speech recognition (ASR) system. This is the context in which the invention was developed, and in which it is presently being applied. However, there is nothing in the invention that limits its application exclusively to speech, or exclusively to data transmission. For instance, the invention may be applied to the transmission and storage of video, or any other digitized signal.

Review of Vector Quantization

Let us suppose that we have a body of data V to be compressed, which is presented as a series of N vectors $v_0, \ldots, v_{N-1}$, each vector consisting of D elements, and each element comprising b bits. Absent application of any data compression method, to transmit V from a sender to a receiver requires us to propagate some N×D×b bits of data through a communication channel. Assuming the communication is error-free, this is lossless transmission: the receiver gets an exact copy of V.

Often in practice the communicating parties do not require the decompressed data to be an exact copy of the original. A reasonable facsimile may suffice, providing that it can be obtained at a suitably low price and/or high speed, and that the received copy is close enough to the genuine article. To put it another way, the sender and receiver may be willing to sacrifice some fidelity, in favor of a lower phone bill, and/or a lower transmission time.

Suppose this is so, and moreover that the vectors $v_0, \ldots, v_{N-1}$ of V are distributed so that they fall naturally into a relatively small number of clusters. FIG. 1 exhibits such a distribution, where some 200 two-dimensional vectors are seen to fall into eight clusters.

Let us now choose a nominal center point of each cluster, not necessarily drawn from the points belonging to the cluster. Call these points $c_0$ through $c_7$. Providing the spread of each cluster around its center point is not too large, we may compress the data as follows:

For each vector v that we wish to transmit, we send the index i of the cluster center $c_i$ that is closest to v.

In general, if this scheme is applied with a total of K clusters, and hence with K associated cluster centers, then this entails transmitting no more than $\log_2 \kappa$ bits for each vector sent. The transmission of the indices may itself be subject to an entropic compression scheme; see below.

If $\log_2 \kappa$ is small compared to D×b, which is the size in bits of one uncompressed vector, then this entails a substantial reduction in the amount of data transmitted. For instance, in the case of FIG. 1, where D=2, suppose each vector element is a 32-bit floating point number. Then, instead of transmitting D×32=64 bits per vector, we can get by with sending only $\log_2 K = \log_2 8 = 3$ bits per vector; a more than 20-fold reduction in the required bandwidth. At the receiving end, when index i arrives, the receiver extracts entry $c_i$ from the codebook, and presents it as the (approximate) reconstruction $\tilde{v}$ of the original vector v.

This scheme is known as vector quantization. The set of K cluster centers $\kappa = \{c_0, \ldots, c_{K-1}\}$ is known as the codebook; the cluster centers themselves are also called code words or code points. While vector quantization can yield a high rate of compression, this comes at a price.

First, the sender must devote memory to storing the codebook; we will refer to this as the sender's codebook cost.

Second, for each vector $v_t$ that is to be transmitted, the sender must determine, via a computation, the index i of the duster center $c_i$ that is closest to $v_t$; we will refer to this as the sender's search cost Third, the receiver must likewise store the codebook, so that upon receipt of the index i, the cluster center $c_i$ may be selected from the codebook, and presented as a reasonable facsimile $\tilde{v}_t$ of the original $v_t$; we will refer to this as the receiver's codebook cost.

Fourth, the communicating parties have given up some fidelity. The receiver has obtained not $v = \langle v_0, \ldots, v_{N-1}\rangle$ but $\tilde{v}=\langle\tilde{v}_0,\ldots,\tilde{v}_{N-1}\rangle$. The fine structure of each cluster about its center has been erased. We will refer to this as coding distortion.

Vector quantization can be expressed succinctly in terms of two functions, one for compression and one for decompression. Let $\kappa=\{c_o^\kappa,\ldots,c_{K-1}^\kappa\}$ be the set of K code points, let $I=\{0\ldots\kappa-1\}$ be the set of valid indices, and suppose v is drawn from $\mathbb{R}^D$, the space of real, D-dimensional vectors. Then the compression algorithm is expressed by a function $g^\kappa:\mathbb{R}^D\to I$, defined by $$g^K(v) = \underset{i \in I}{\operatorname{argmin}} \| v - c_i^K \|. \quad (1)$$

In words, $g^\kappa(v)$ is the index of the code word in $\kappa$ that is closest to v. The (not exactly) inverse decompression algorithm is likewise expressed by a function $h^\kappa:I\to\mathbb{R}^D$, defined by $$h^\kappa(i)=c_i^\kappa. \quad (2)$$

We call (1) and (2) above the compression and decompression equations respectively. It will be useful in what follows to have a succinct expression for the map from a vector v to its reconstructed facsimile $\tilde{v}$. Note that this is neatly provided by the composition of $g^K$ with $h^K$, because $\tilde{v}=h^\kappa(g^\kappa(v))$. We will denote the composition $h^\kappa \diamond g^\kappa$ by $\mathcal{T}^\kappa$; that is $$\tilde{v}=\mathcal{T}^\kappa(v)=(h^\kappa \diamond g^\kappa)(v)=h^\kappa(g^\kappa(v)). \quad (3)$$

We will refer to this as the quantization equation, and call $\mathcal{T}^\kappa$ the quantization function.

The Problem Solved by the Invention

Our pedagogical example above has a small codebook, totaling 8 centers×2 elements/center×32 bits/element=512 bits. Due to the small number of entries, and the short vector lengths, it is easy to search this codebook for the closest codeword.

However, this is not typical. To give some feeling for the characteristics of a real-world data compression task, we consider the application that motivated this invention: compression of human speech, represented as a sequence of twelve-dimensional mel-frequency cepstral coefficient (MFCC) vectors. Prior to the introduction of this invention, this application used a vector quantization scheme that involved two distinct codebooks, at both sender and receiver, each containing 4096 code words, with each vector element a 4-byte floating point number. The memory for each pair of codebooks was therefore 2 codebooks×4096 vectors/codebook×12 elements/vector×32 bits/element=3,145,728 bits. Furthermore, the sender's search cost dominated, by a factor of 3 to 5, the cost of the MFCC computation that was generating the data to be compressed. The compression achieved in this application was to compress a 384 bit vector into 24 bits of data.

Elimination of these costs is the central problem that the invention solves. In this document we disclose a method for data compression that reduces the sender and receiver codebook costs to zero, and the sender's search cost to zero. There is no explicit codebook to be searched for compression, and none used for reconstruction, so all of these costs are simply eliminated. Yet the method, when it may be applied, does not significantly decrease the degree of compression achieved, or increase the coding distortion. In the real world example discussed just above, the invention when applied yielded identical compression, again reducing a 384 bit vector to 24 bits of compressed data. Yet the fidelity of the reconstructed data was good enough to achieve per-word recognition accuracy, by an automatic speech recognition system, that matches the results achieved by the prior, costly compression scheme.

In place of the codebook and search costs, our invention imposes a transform storage and compute cost, on both the sender and receiver. These costs are so low—on the order of $10^2$ to $10^3$ smaller than typical search and codebook costs—that they may be considered negligible.

Metrics, Codebooks and Voronoi Diagrams

Some fine points of vector quantization must be noted here, which will figure in the discussion to follow.

Figure 1B:
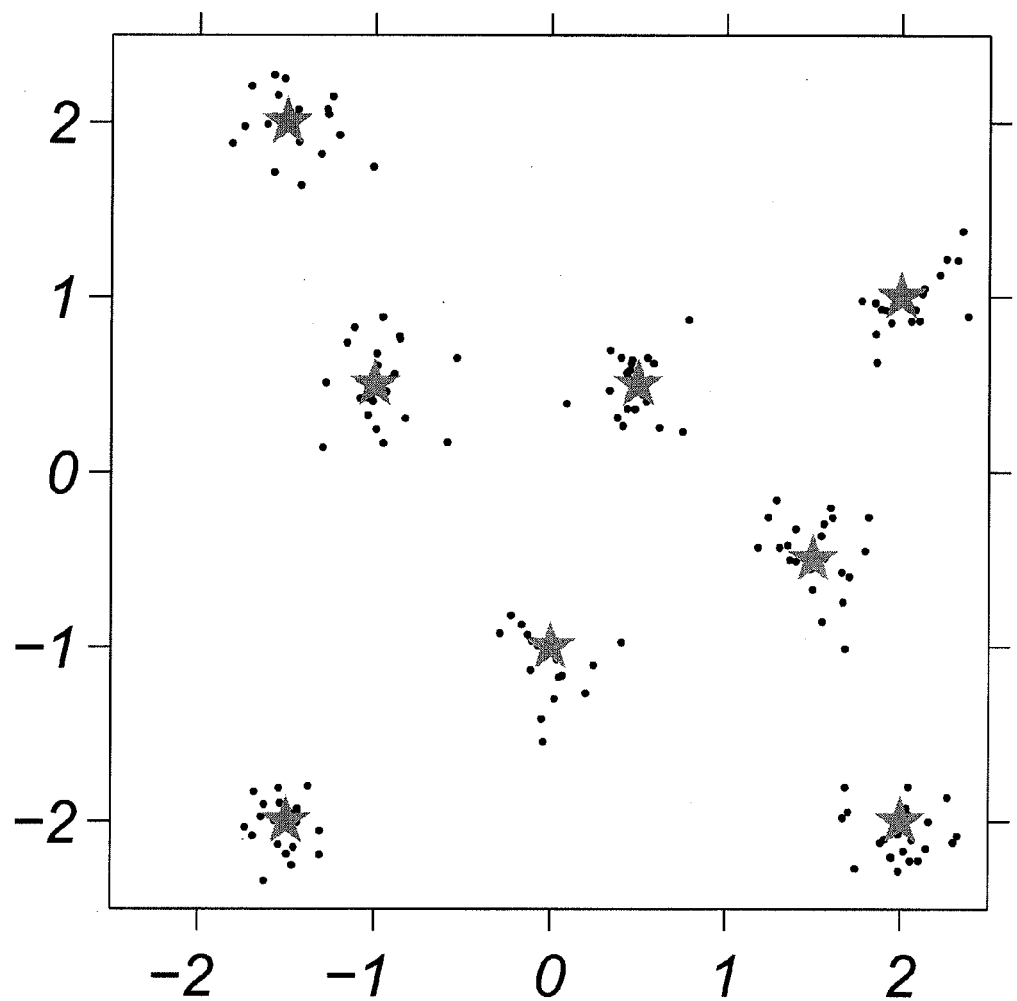

First, we have so far sidestepped the issue of just what constitutes a cluster of data points, or indeed what measure should be used to decide which code point is closest to a given vector. FIGS. 1a and 1b show data for compression, where FIG. 1a shows 200 two-dimensional vectors plotted, each marked by a dot, and seen to fall naturally into eight clusters, and FIG. 1b shows the same data plotted, along with nominal cluster centers, each marked by a star. By presenting the concept with the aid of FIGS. 1a and 1b, we have implicitly endorsed the Euclidean norm as the appropriate metric. However, unless the encoded data arose from some real-world geodetic measurements—for instance, the distribution of uncollected golf balls on a driving range—there is really no inherent reason to use this measure. Indeed, in an abstract setting, such as the coding of MFCC vectors, there is substantial reason to prefer the Mahalanobis norm. We discuss this topic further below. For now we note that the metric that appears in the compression equation (1) is understood to be arbitrary.

Second, we have made no mention of a host of practical details concerning the codebook, notably how the sender and receiver establish a common codebook, how closely a codebook is tied to a particular data set intended for compression, how clusters are found, and how cluster center points (that is, code words) are chosen. For concreteness of this exposition we will make some simplifying assumptions on these topics; we will explore variations on these assumptions after presenting the fundamental idea.

Specifically, we will assume that the designer of the system supplies a fixed codebook to the sender and receiver when the system is deployed. This codebook is developed by examination of a collection of examples $E=\langle v_0,\ldots,v_{E-1}\rangle$, containing $E=|\epsilon|$ vectors, each of dimension D, comprising data typical of the kind that will be presented to the deployed system, once in operation. That is, the properties of the data processed by the deployed system are assumed to match closely with those of E, at least with respect to the characteristics that are important for vector quantization. E is assumed to be very large; in particular E>>D, the dimension of the vectors. We will refer to the elements of E variously as example points or training data.

Regarding the method for creating the codebook, we will now briefly describe the widely used iterative K-means algorithm. This method is so named because it iteratively establishes a sequence of codebooks by repeatedly partitioning the training data into a collection of K clusters, and then determining the code words of a new codebook as the arithmetic means of the cluster members. The details of the algorithm are found in FIG. 2.

In the following discussion we will make use of the Voronoi diagram, a notion that is related to the partitioning step of the K-means algorithm. FIG. 2 shows the conventional K-means algorithm. This is a widely used algorithm for determining vector quantization codebooks. As discussed in FIG. 2, at step 6a of each iteration, the K-means algorithm partitions the elements of E with respect to a set of code points, thereby decomposing E into a collection of disjoint subsets. In much the same way, the space of all possible data vectors, from which the elements of E are drawn, may itself be partitioned with respect to a given codebook into non-overlapping regions, called Voronoi cells. There is one cell per code point; each cell consists of those points in the space that are closer to the given code point than any other. This partition depends as well upon the particular metric in use; in this discussion we will use the Euclidean metric. A diagram that exhibits the boundaries between these cells—the boundaries consist of the points that are equidistant from two or more code points— is known as a Voronoi diagram.

Figure 3A:
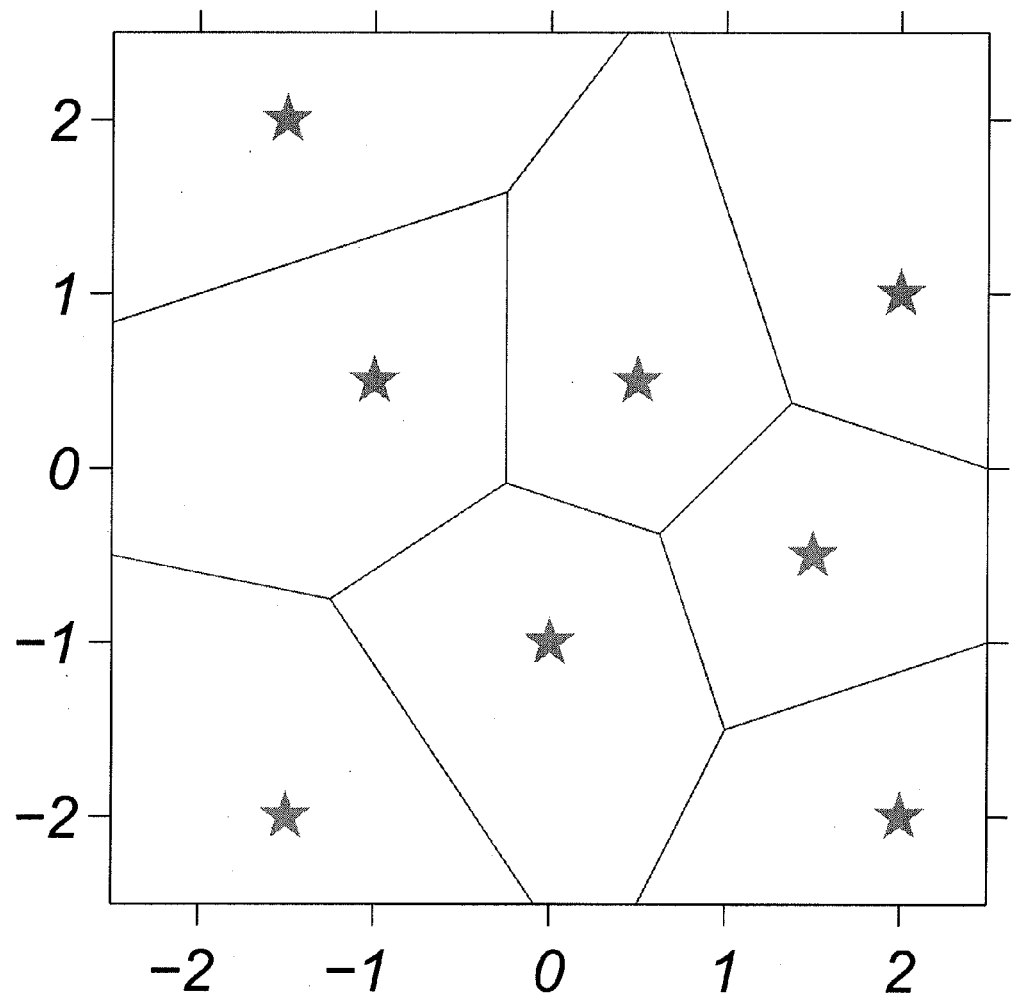
FIG. 3a is a Voronoi diagram which shows the cell boundaries, which are points in the plane equidistant from the code points of adjoining cells.

FIG. 3a is a Voronoi Diagram. The collection of code points shown implicitly divides the plane into non-overlapping cells, one per code point. The cell for code point $c_i$ consists of all the points in the plane that are closer to $c_i$ than to any other entry in the codebook $\kappa$. The Voronoi diagram shows the cell boundaries, which are points in the plane equidistant from the code points of adjoining cells.

Figure 3B:
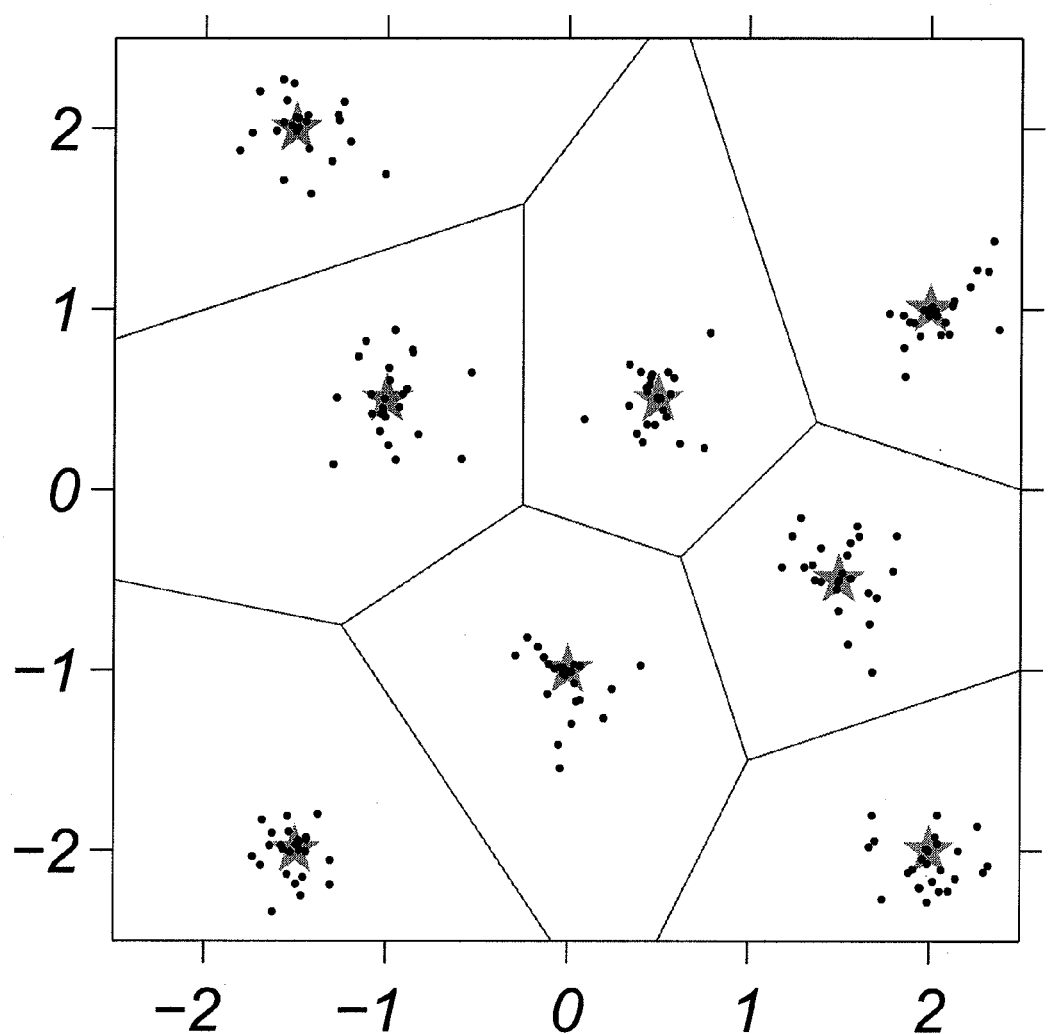
FIG. 3b shows a Voronoi diagram with data points added.

FIG. 3b shows a Voronoi diagram with data points added. This illustrates how the Voronoi diagram implicitly represents the compression function. FIG. 3a is the Voronoi diagram for the code points of FIG. 1. Note that from symmetry considerations, the boundary between any two adjoining cells is always the perpendicular bisector of the line segment that connects the code points associated with each cell.

For graphic clarity, the example presented in the figure treats the plane, $\mathbb{R}^2$. However the notion of the Voronoi diagram is well-defined in any normed, finite dimensional vector space. In the case of $\mathbb{R}^D$, the Voronoi cells are D-dimensional polytopes, bounded by D-1-dimensional hyperplanes. Moreover, we have this generalization of the observation at the end of the preceding paragraph: in the case of the Euclidean metric, the boundary between adjoining cells is comprised of (a portion of) the hyperplane that bisects, and is orthogonal to, the line connecting the two associated code points.

Voronoi diagrams and vector quantization are intimately related, as follows. The Voronoi diagram for a given codebook $\kappa$, and the association between code points and Voronoi cells, amounts to a graphical presentation of the information that is encapsulated in the compression function $g^\kappa$. For if we know that a given vector v lies in a specific Voronoi cell, then the cell's associated code point $c_i$ is the closest in $\kappa$ to v, and thus $g^\kappa(v)=i$. This idea is exhibited in FIG. 3b.

Figure 4A:
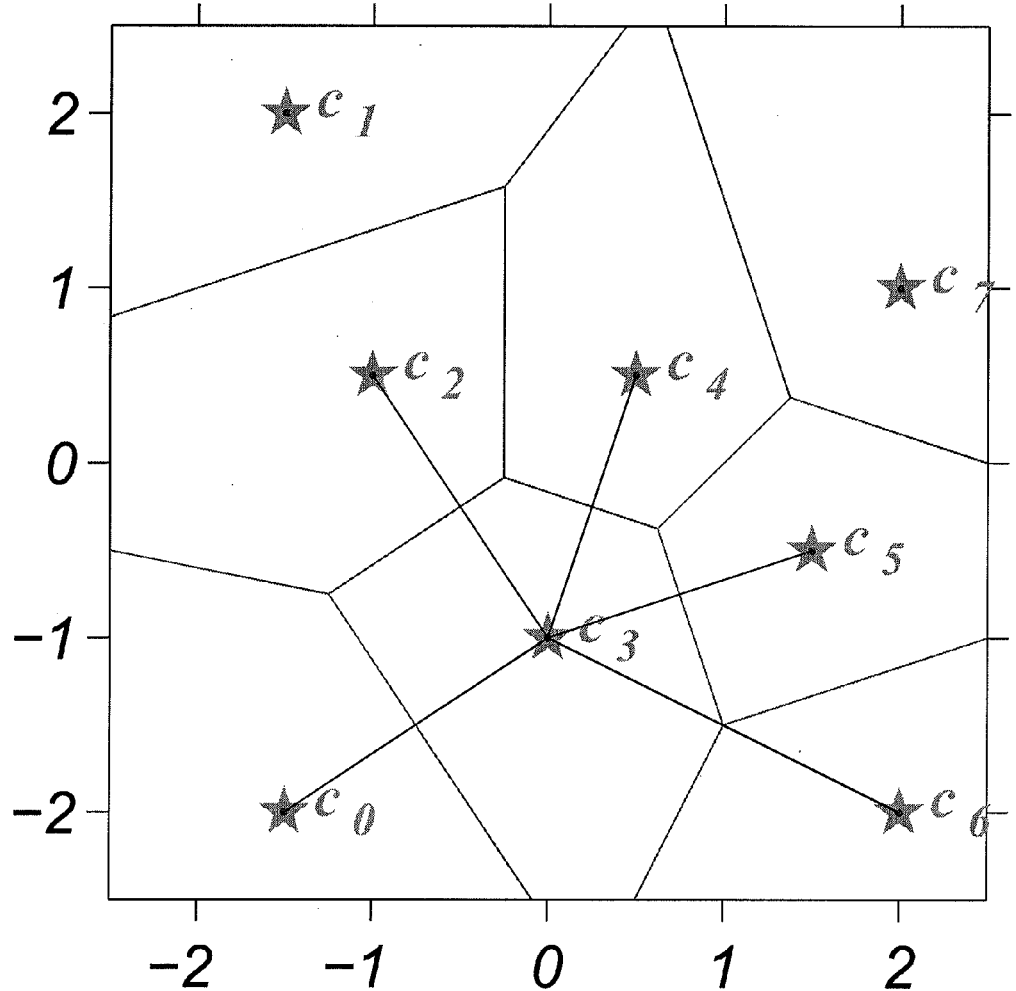
FIGS. 4a and 4b show symmetry properties of adjacent code points and associated cell boundaries.
Figure 4B:
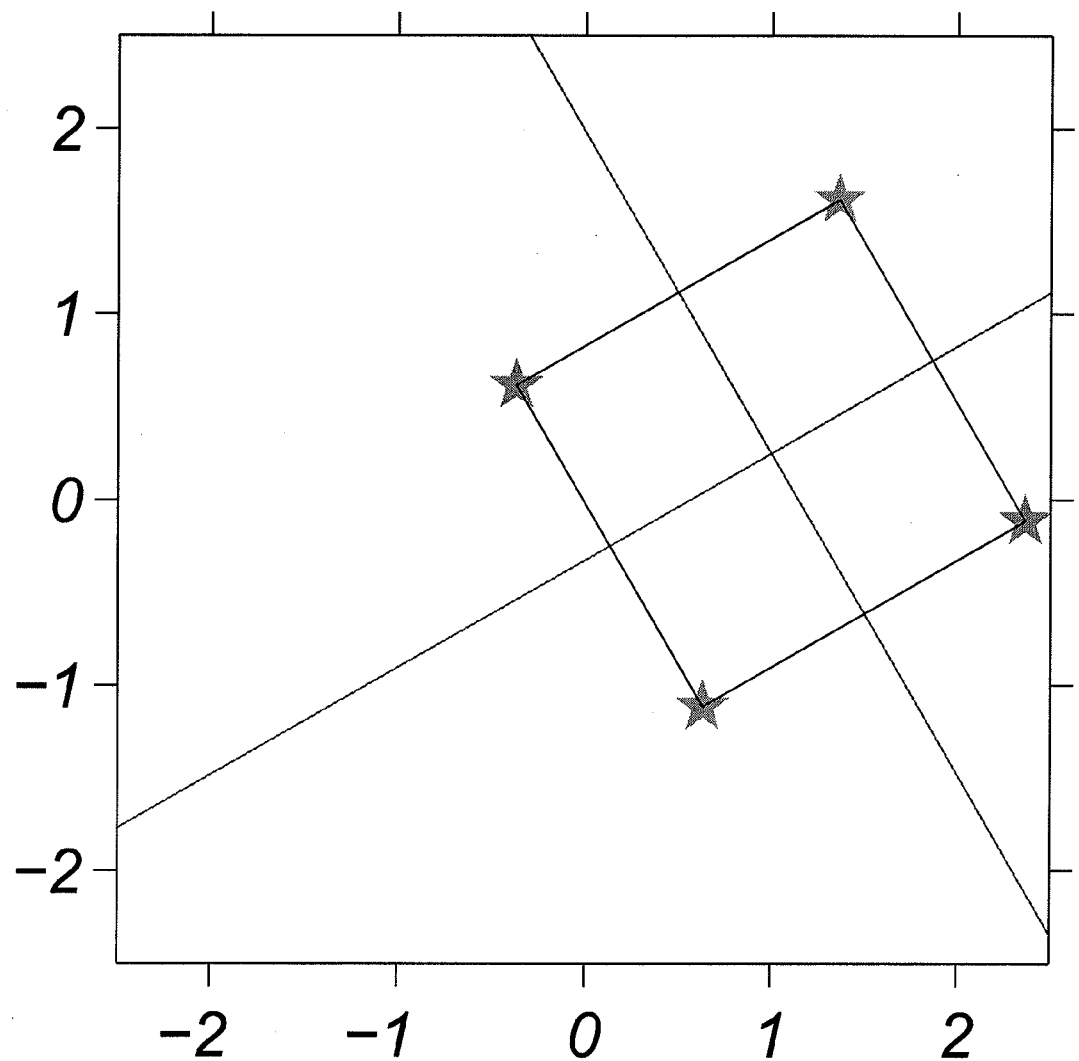

FIGS. 4a and 4b show symmetry properties of adjacent code points and associated cell boundaries. As these two examples illustrate, the boundaries between adjacent Voronoi cells are perpendicular bisectors of lines connecting the code points of the respective cells.

The Fundamental Idea

The fundamental idea of the invention is the following observation: If in a plane, a set of four code points are chosen to lie at the vertices of a square centered at the origin, with edges orthogonal to the coordinate axes, say $$\kappa=\{<+1,+1>,<-1,+1>,<-1,-1>,<+1,-1>\}, \quad (4)$$

then the associated Voronoi cells are the four quadrants of a conventional Cartesian coordinate system, and the cell boundaries are the coordinate axes themselves.

Figure 5A:
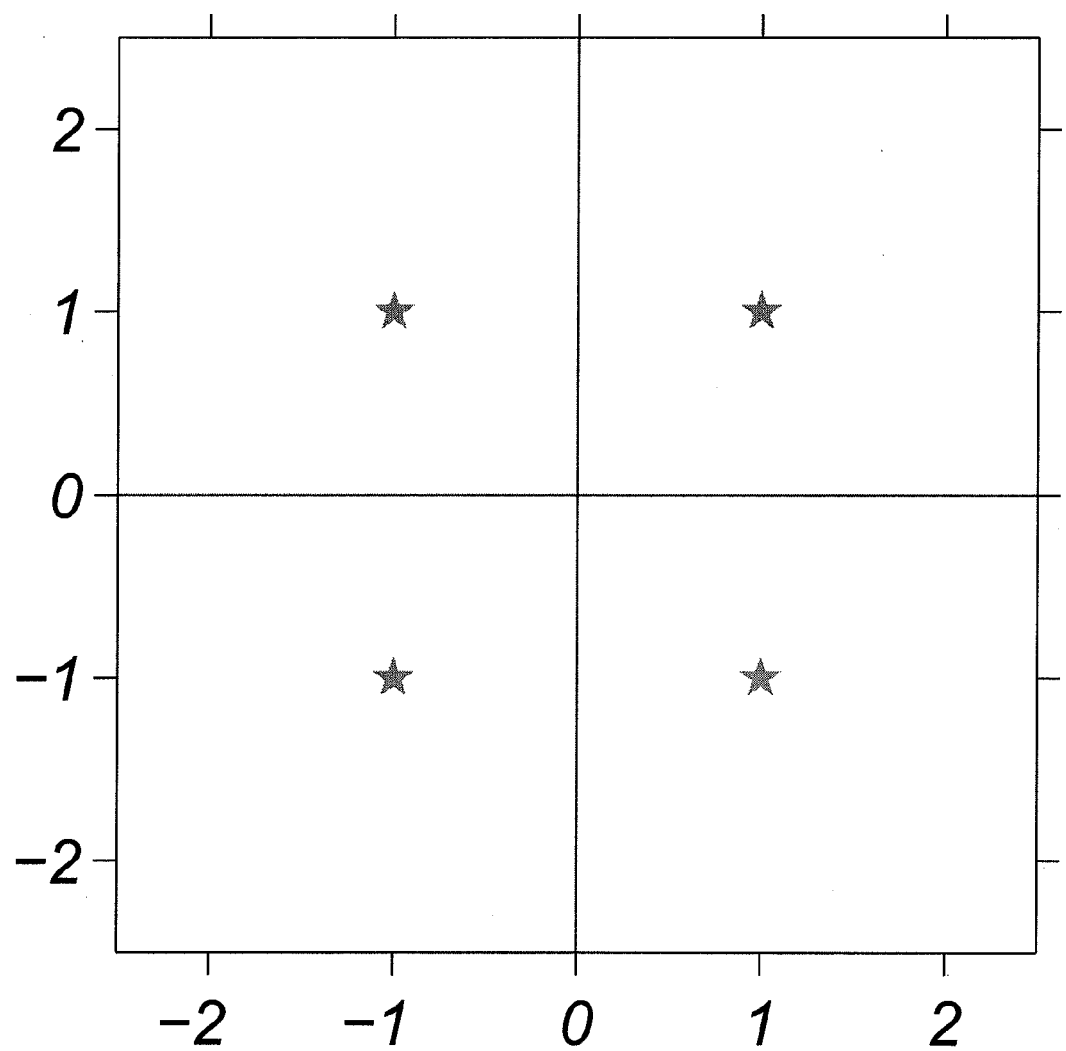
FIG. 5a shows a square and its Voronoi diagram.
Figure 5B:
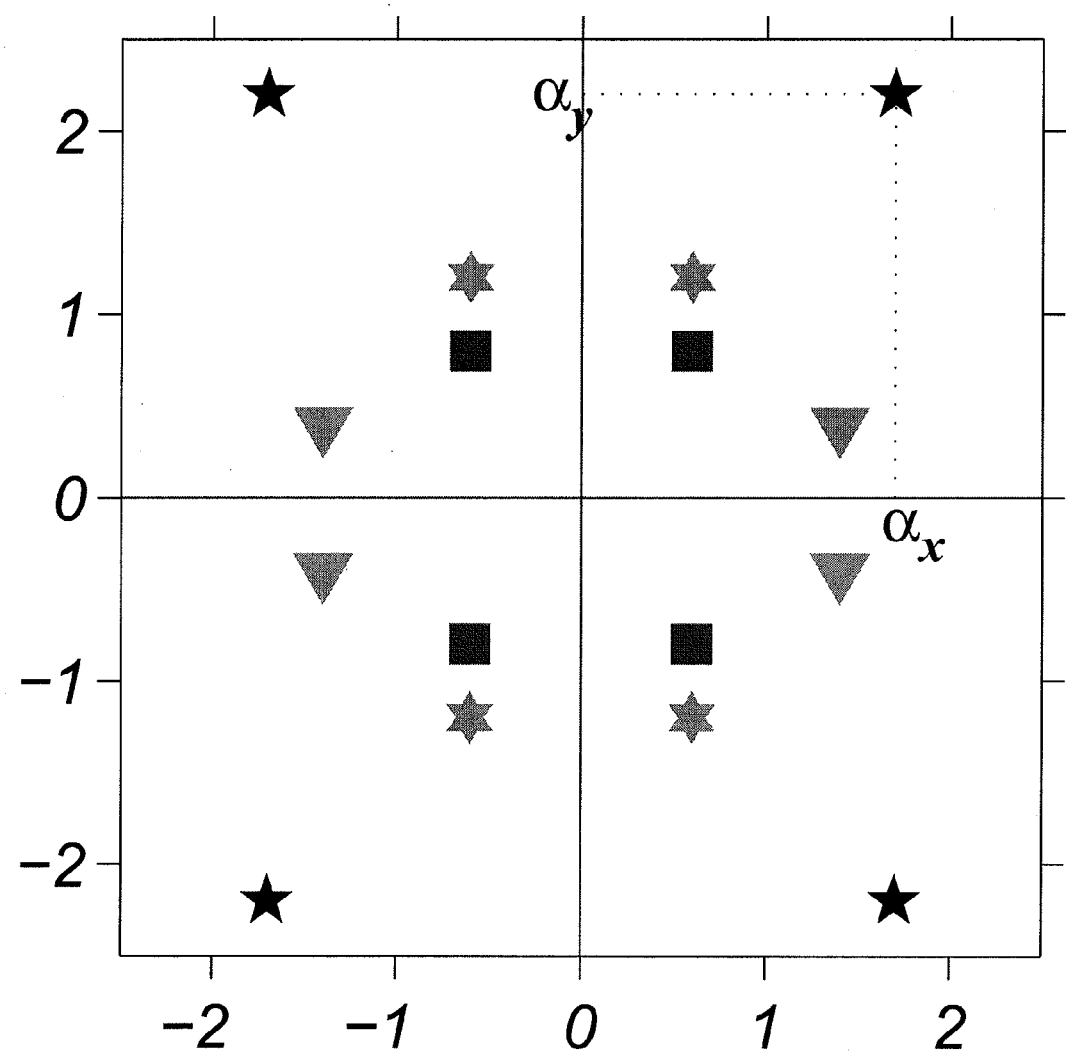
FIG. 5b shows a variety of rectangles, each with (the same) perfect Voronoi diagram.

FIGS. 5a and 5b show perfect Voronoi diagrams. FIG. 5a shows a square and its Voronoi diagram. FIG. 5b shows a variety of rectangles, each with (the same) perfect Voronoi diagram. FIG. 5a also shows the meaning of the radius vector $\overline{\alpha}$, for the rectangle with vertices marked by *. FIG. 5a exhibits this codebook, and its associated Voronoi diagram, which we will refer to as a perfect Voronoi diagram. We say the Voronoi diagram is perfect because the cell boundaries correspond exactly with the coordinate axes of the plot.

In a slight abuse of terminology, we will say that the square of FIG. 5a has radius 1 because it encloses a circle that has radius 1, in the conventional sense.

Some generalization of this claim is possible. As a consequence of the symmetry considerations discussed in the preceding section, the same perfect Voronoi diagram obtains, no matter what the square's dimensions. Indeed, the figure does not even have to be a square. It can be a rectangle, of arbitrary edge lengths, providing that the rectangle is centered at the origin, and that the sides of the rectangle are orthogonal to the coordinate axes. The associated Voronoi diagram will always be perfect; this is exhibited in FIG. 5b.

The significance of these observations is that because the Voronoi diagram is perfect, the compression function $g^\kappa(v)$ is trivial to compute. By inspecting only the signs of the elements of v, it is possible to determine in which quadrant—and hence in which Voronoi cell—the vector lies, and thereby determine the index of the associated code point. No search per se is involved, and no codebook is ever consulted. Yet the nearest code point is known exactly.

All these observations have generalizations from 2 dimensions to D dimensions, as follows. The associated figure, the vertices of which constitute the codebook, is a D-dimensional hypercube, or D-hypercube for short. The vertices of a D-hypercube of radius 1, centered at the origin, with faces that are orthogonal to the coordinate axes, are determined as the D-fold Cartesian product $$\kappa=\{+1,-1\}\times\{+1,-1\}\times\ldots\times\{+1,-1\}, \quad (5)$$

where the doubleton $\{+1,-1\}$ appears D times in the product. This figure has $2^D$ vertices, corresponding to a codebook with $2^D$ entries. (The notation $2^D$ denotes the integer 2 raised to the D th power, a function that grows exponentially with D.) Note that the advantage afforded by this construction becomes ever greater as D increases. For the size of the notional codebook, and hence the workload of the associated search, both grow exponentially with D. Yet both codebook and search may be dispensed with: finding the code point of $\kappa$ nearest to a given vector v reduces to inspecting the sign of its D elements.

Figure 6:
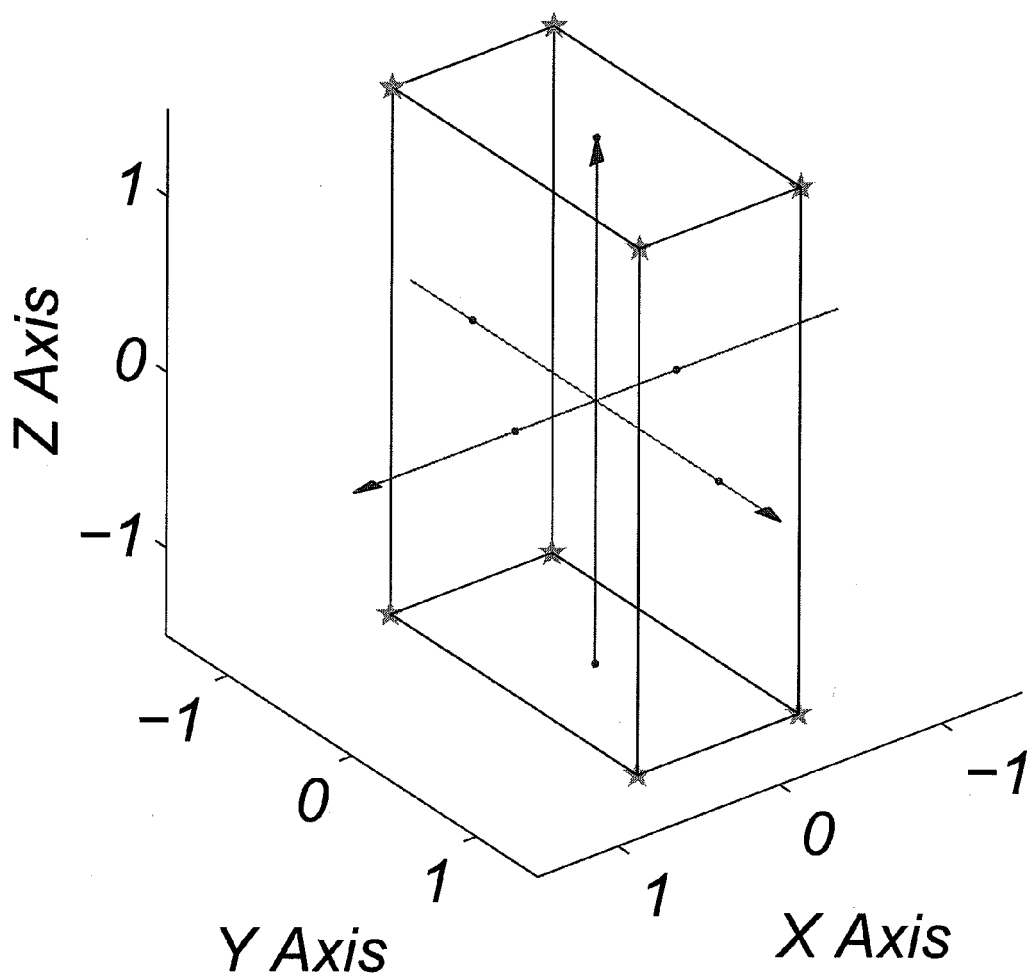
FIG. 6 show a perfect hypercube codebook, for D=3.

FIG. 6 shows a perfect hypercube codebook, for D=3. The radius vector for this codebook is $\overline{\alpha}=<1/2,1,3/2>$.

We will refer to $\kappa$ as constituted in (5) as a radius 1 hypercube codebook. If the quantity 1 in (5) is replaced by an arbitrary positive real number $\alpha$, we will say that $\kappa$ is a radius $\alpha$ hypercube codebook.

In the two-dimensional case, both squares and rectangles had perfect Voronoi diagrams. There is a suitable generalization for D dimensions as well. In D dimensions, a Voronoi diagram is perfect if and only if each cell boundary is comprised of D-1 dimensional hyperplanes that are the span of D-1 coordinate axes. Now let $\overline{\alpha}=<\alpha_1,\alpha_2,\ldots,\alpha_D>\in\mathbb{R}^D$ be a vector with strictly positive elements. Then again by symmetry considerations, the codebook defined by $$\kappa=\{+\alpha_1,-\alpha_1\}\times\{+\alpha_2,-\alpha_2\}\times\ldots\times\{+\alpha_D,-\alpha_D\} \quad (6)$$

also has a perfect Voronoi diagram. This is shown, along with the meaning of the elements of $\overline{\alpha}$, in FIG. 5a. In a slight abuse of language, we will say that this is a radius $\overline{\alpha}$ hypercube codebook, even though in fact it is more properly described as a hyperrectangle; we will also refer to $\bar{\alpha}$ as the hypercube's radius vector.

Note that by virtue of (6), the D-element vector $\bar{\alpha}$ defines a codebook, hereafter written $\kappa(\bar{\alpha})$, comprising $2^D$ elements. We will refer to $\kappa(\bar{\alpha})$ as an implicit codebook, and each of the vertices of $\kappa(\bar{\alpha})$ as an implicit code point This representation affords a great economy. Suppose each coordinate of $\bar{\alpha}$ is recorded with a precision of b bits. Then the implicit codebook $\kappa(\bar{\alpha})$ is specified in full by b×D bits. Whereas recording all the code points of $\kappa(\bar{\alpha})$ explicitly, that is, as elements of $\mathbb{R}^D$. requires some b×D×$2^D$ bits. It is in this sense that the implicit representation of a hypercube codebook is exponentially smaller than the explicit version.

There is no guarantee that any hypercube codebook will provide suitably low distortion for a given compression task. Surprisingly, suitable hypercube codebooks may be found for many data compression tasks, via a second element of the invention. We now explain the idea behind this second element.

Figure 7A:
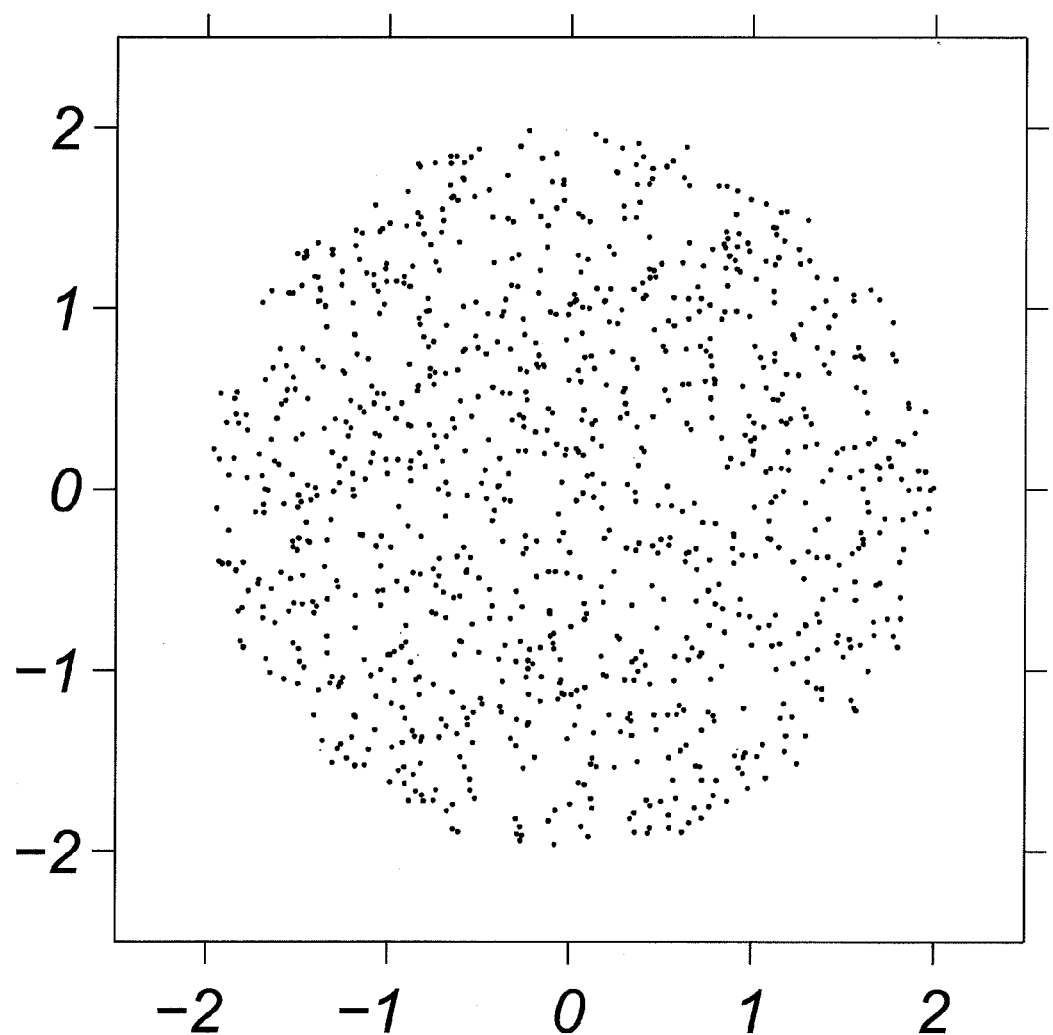
FIG. 7a shows sampled symmetric data, where 1000 points are sampled from a uniform distribution on a disc of radius 2.

To develop the necessary intuition, we focus our attention now on the two-dimensional case, and suppose that the data to be compressed are uniformly distributed in a disc centered at the origin. An example of such a data set, consisting of 1000 points sampled from a uniform distribution within a circle of radius 2, appears in FIG. 7a, which shows sampled symmetric data, where 1000 points are sampled from a uniform distribution on a disc of radius 2.

Figure 7B:
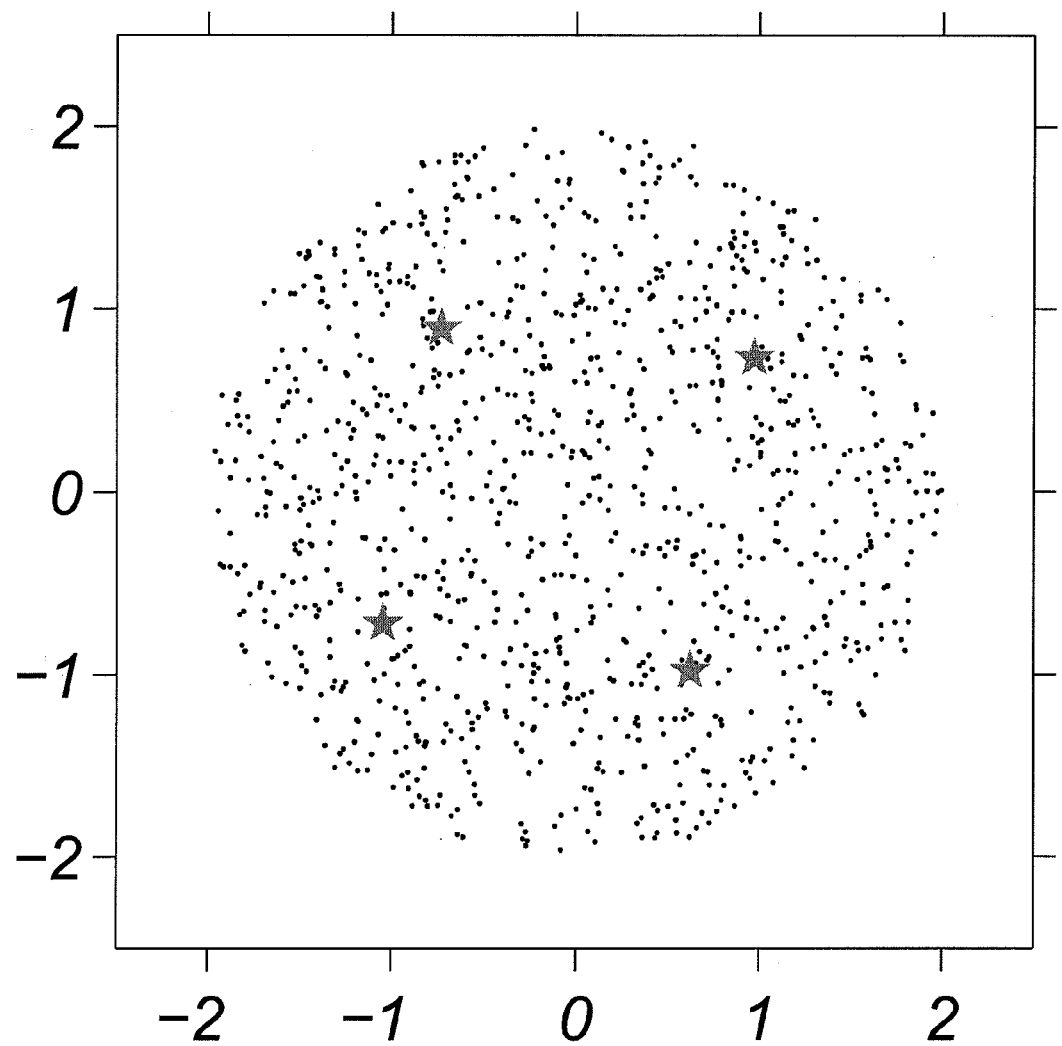
FIG. 7b shows a K-means solution, where a 4-point codebook is computed via 100 K-means iterations.

In this special case, it can be shown that the best possible arrangement of four code points, from the standpoint of minimizing coding distortion, is obtained when they are located at the vertices of a square, likewise centered at the origin. An experimental verification is provided in the FIG. 7b, which shows the results of 100 K-means iterations, executed to determine a codebook of four elements. The locations of the code points approximate the vertices of a square, centered at the origin. Indeed, it is possible to show analytically that the best possible codebook is a square with an edge length of $16/3\pi \approx 1.6977$, which is close to the dimensions in the figure.

Figure 8A:
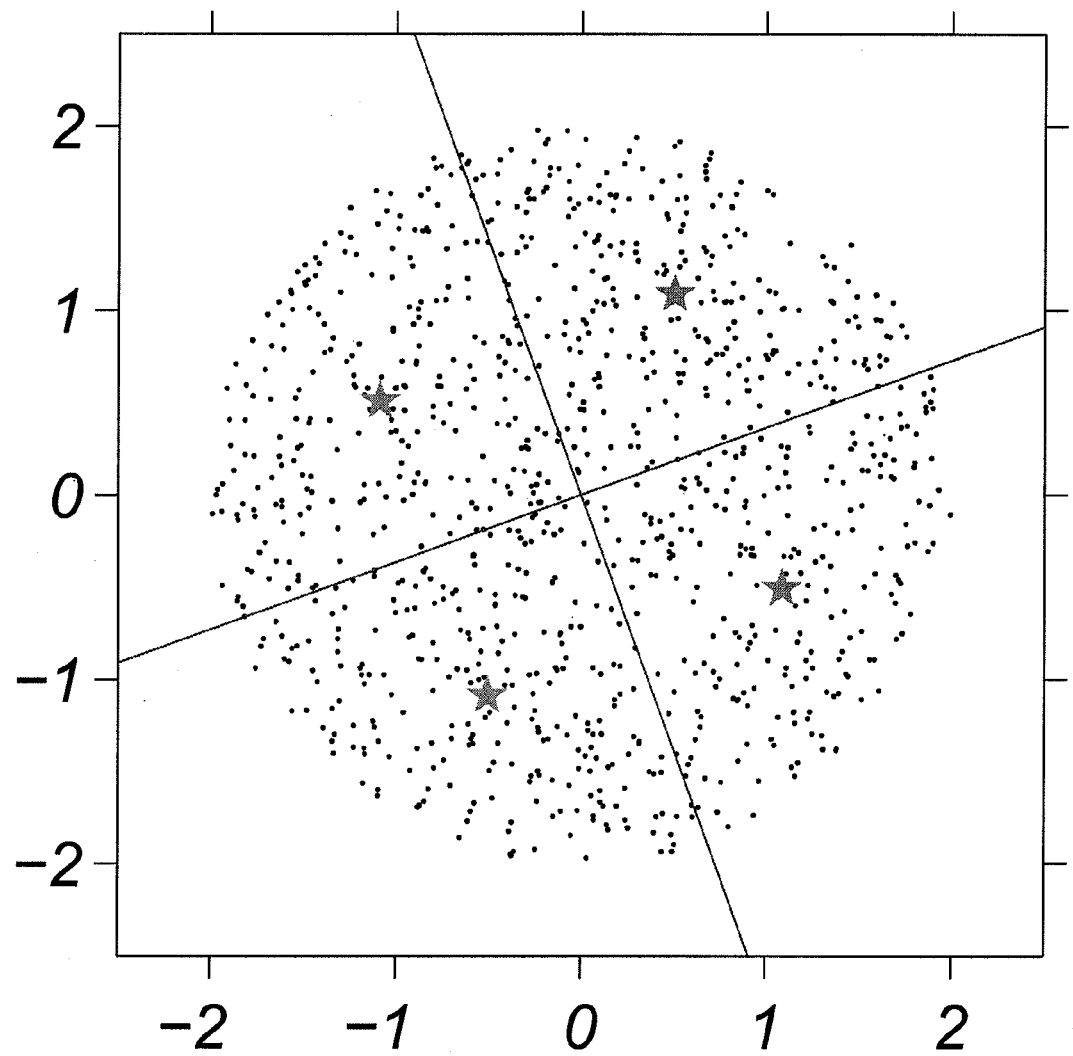
FIGS. 8a and 8b show equivalent codebooks and Voronoi diagrams at two rotations.
Figure 8B:
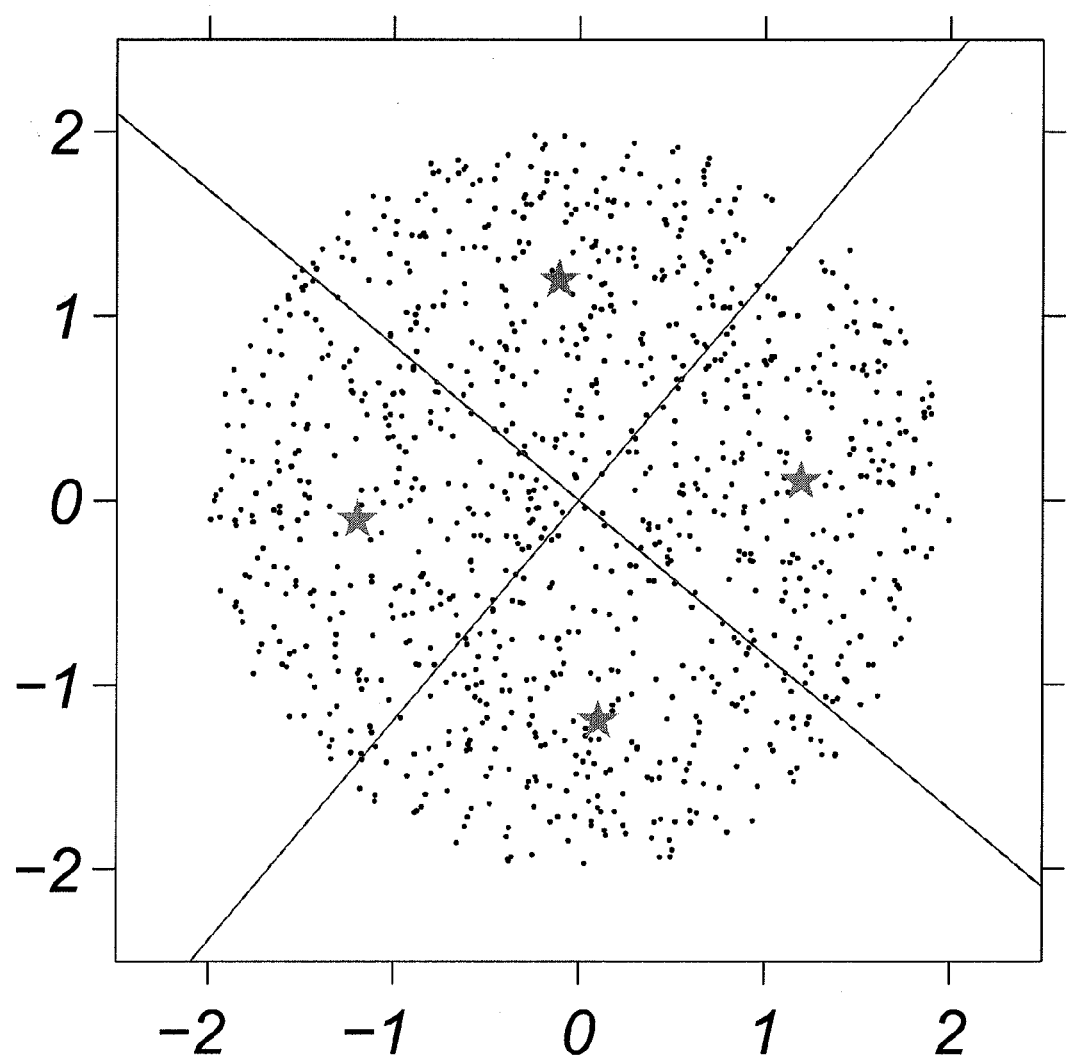

Now comes a key observation. We continue to consider the hypothetical case of a symmetric disc of data points, with the codebook formed from a square centered at the origin. The distortion obtained with this codebook is independent of the orientation of the square. This follows from a symmetry argument: because the data to be compressed are, by assumption, uniformly distributed within the disc, there can be no preferred direction for orienting the square that defines the codebook. The idea is illustrated in FIGS. 8a and 8b.

Figure 9:
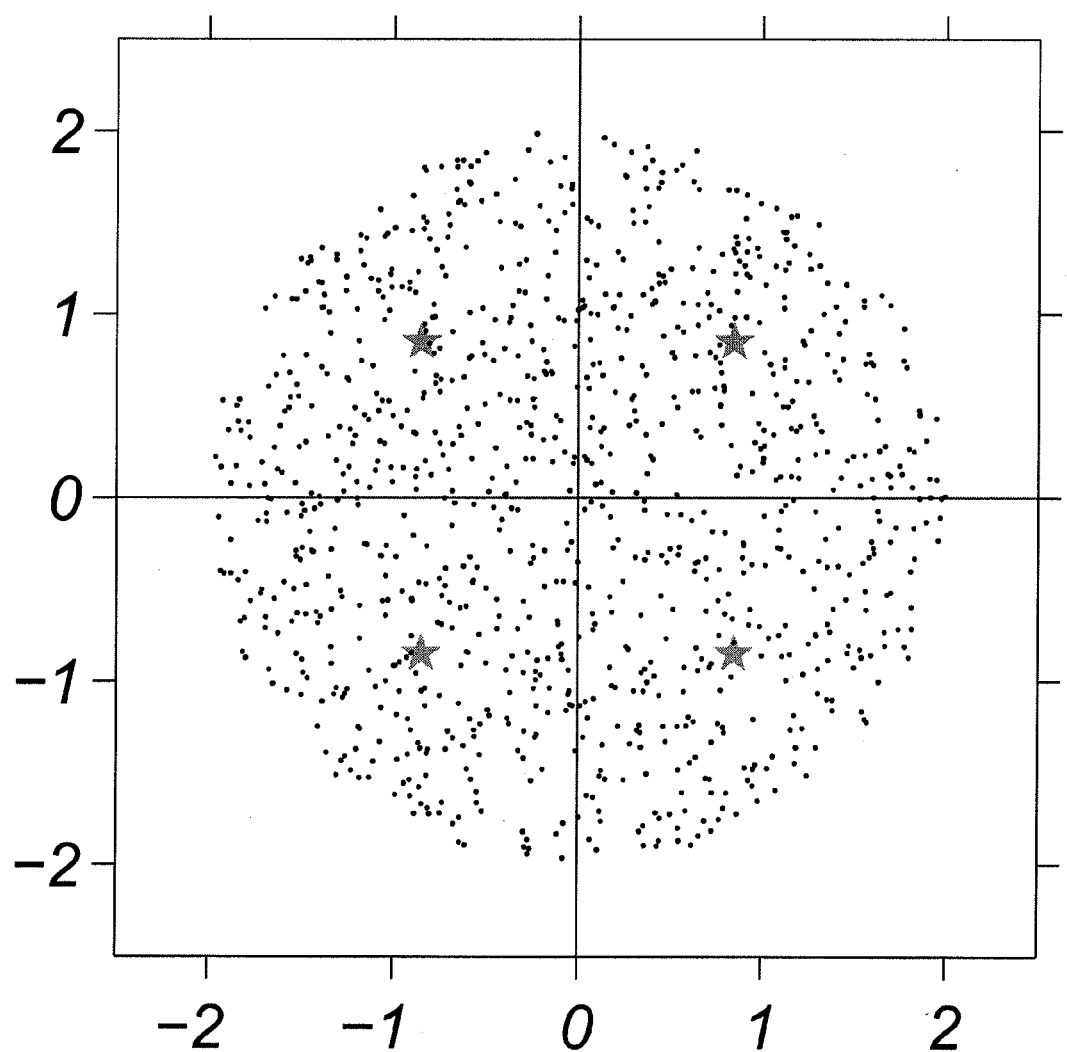
FIG. 9 shows an optimal codebook with a perfect Voronoi diagram.

This being the case, we can choose the orientation as we wish, without paying any penalty, or conversely, realizing any improvement, in the coding distortion. In particular, we may orient the square so that its Voronoi diagram is perfect. If we do so, and if the square has the optimal edge length mentioned above, we obtain a vector quantization scheme that requires neither a search nor an explicit codebook, and also achieves the lowest possible distortion, for any four-element codebook. This choice is exhibited in FIG. 9.

This all depends upon the presumption that the data are uniformly distributed within a circle centered at the origin, a condition that seems highly artificial and unlikely. But this then immediately suggests the following general scheme: given a D-dimensional vector quantization problem, let us seek a simple, invertible function that may be applied to its associated example data set E, such that the transformed data set will approximate a uniform distribution within a D-dimensional sphere. We may then compress transformed vectors arising from the data source, by quantizing them with respect to a suitable D-hypercube codebook. We will refer to the desired function as a symmetrizing transform.

This proposal is notably incomplete, in that it does not provide any hint of what form such a transform might take, much less a prescription for how to find it. Nor does it supply the radius vector for the codebook. These however are the next two elements of the invention that we will explain: an algorithm for finding the desired transform, and one for determining the radius vector of the associated codebook.

Two important caveats must be mentioned.

First, in the general case of data distributed in $\mathbb{R}^D$, as opposed to the particular case of $\mathbb{R}^2$ explored here, there is no guarantee that a D-hypercube codebook, of any radius vector, will achieve the minimal distortion for a codebook of $2^D$ elements. This is so even if the vectors to be compressed are indeed distributed uniformly within a D-sphere. Nevertheless, in practice the method of the invention has proven to be highly effective.

Second, even if a given codebook is optimal for its size, in the sense of achieving minimum distortion for a fixed number of code words, there is no guarantee that the reconstructed data will exhibit sufficiently high fidelity to the original.

In the next two sections we explain how to compute the symmetrizing transform, and the optimal D-hypercube codebook, respectively.

Finding a Symmetrizing Transform

Here we explain how to find the required symmetrizing transform. The technique we will develop is not the only possible approach to the problem. Independent of this particular method, we claim priority on the general idea of efficient vector quantization via D-hypercube codebooks, with a symmetrizing transform determined by this or any other technique, or without any transform step at all.

Finding the Transform

By assumption we are supplied with a large example data set $E \subset \mathbb{R}^D$, which exhibits the same statistics as the data that will be encountered in deployment. Without loss of generality we may further assume that $\epsilon$ has zero mean; that is $\Sigma_{\upsilon \in E} \upsilon = 0$, and by extension the same is true of the source data itself. If this is not the case then we compute a mean $\mu = \Sigma_{\upsilon \in E} \epsilon \upsilon / E$, form a new example collection $E' = \langle \upsilon - \mu | \upsilon \in E \rangle$, and operate thereafter on E', incorporating the subtraction of $\mu$ as the first step of the transform we seek. Here, we have written E for |E|, the number of vectors in E.

Figure 10A:
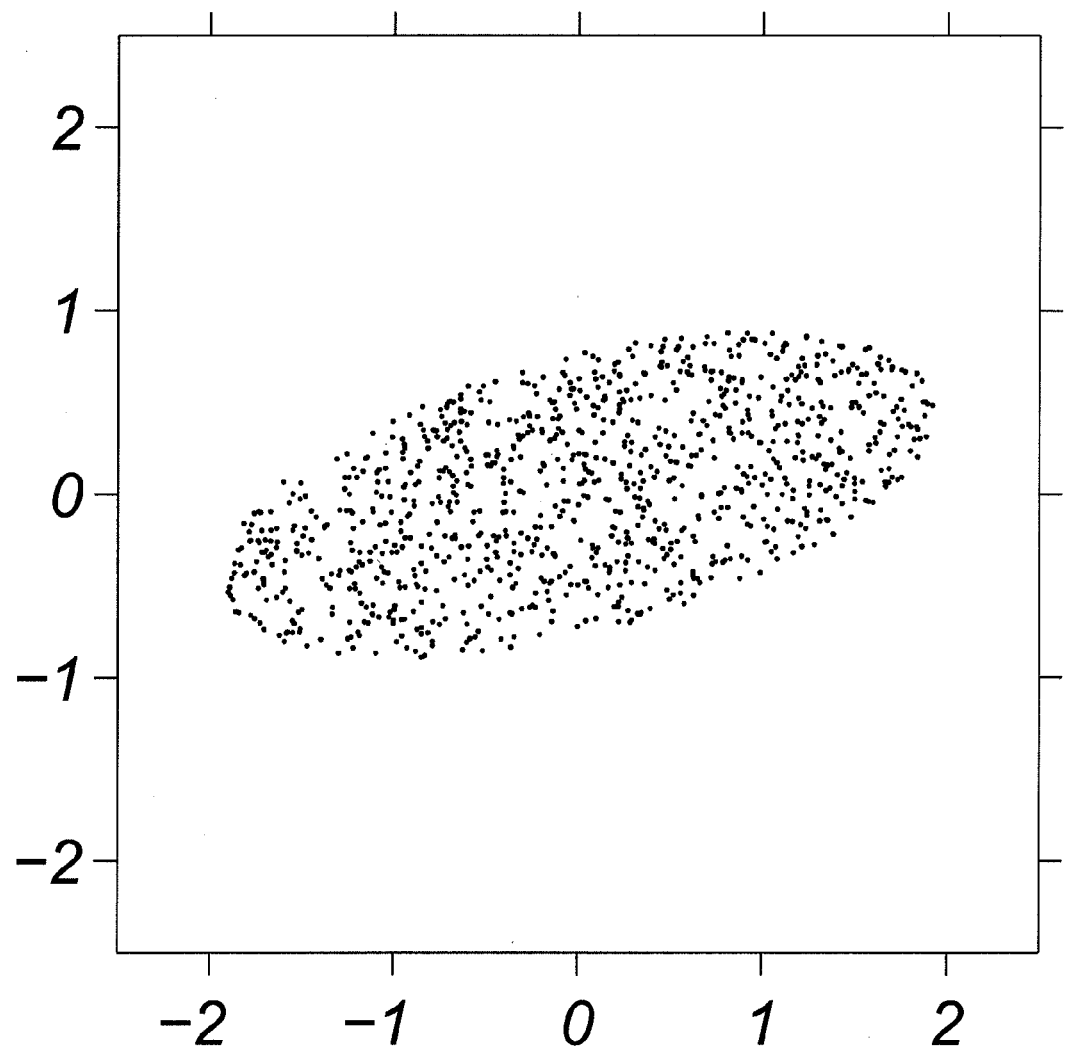
FIGS. 10a and 10b show the intended effect of the symmetrizing transform, where
Figure 10B:
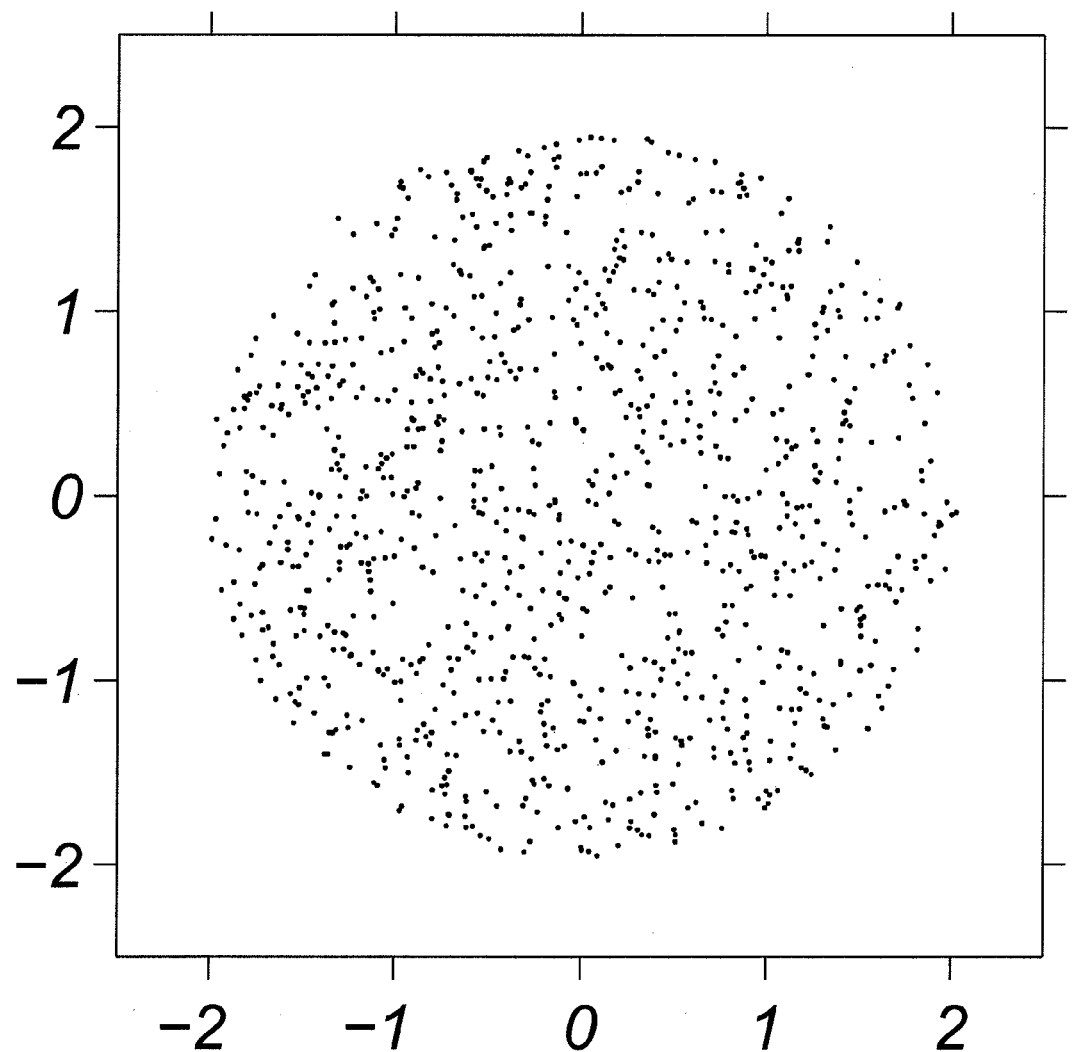

Now observe that if a zero-mean data set D is spherically symmetric about the origin, its covariance matrix, which we will write as Z(D), is a scalar times the identity matrix. Although the converse is decidedly not true—there are zero mean data sets, not spherically symmetric, for which the covariance matrix is a scaled identity matrix—we will nevertheless adopt the following plan: we seek a linear transform $T:\mathbb{R}^D \to \mathbb{R}^D$, such that $Z(TE)=I$. We will then use T as the symmetrizing transform. Here I denotes the D×D identity matrix, and the notation TE means $\langle T\upsilon | \upsilon \in E \rangle$, which is a copy of E with T applied to each vector. The intended effect of T is illustrated in FIGS. 10a and 10b. FIG. 10a shows data before transform (E, 1000 points distributed within an ellipse); FIG. 10b shows data after transform (TE, same 1000 points, transformed by T).

We proceed to develop an algorithm for finding T, consistent with the symmetry criterion just adopted. It is worth noting here that other criteria may be used, which will likely lead to different transforms. The method is a standard manipulation in linear algebra, yielding a so-called whitening transform; one novel aspect of the invention lies in the way that we apply this technique.

Recall the definition of the covariance matrix of a zero-mean data set E, $$Z(E) = \frac{1}{E} \sum_{v \in E} v \otimes v^t. \qquad (7)$$

By assumption each element v of E is a D-element column vector; $V^t$ denotes its row-vector transpose. The symbol $\otimes$ denotes outer product. Note that by virtue of this definition, Z(E) is a symmetric, positive-semidefinite matrix. Hence by virtue of the spectral theorem (see Howard Anton, *Elementary Linear Algebra*, John Wiley and Sons, 1973; Theorems 6.7 and 6.8), there exists an orthonormal collection of D eigenvectors, $(z_1, \ldots, z_D)$, with associated real, non-negative eigenvalues $(\lambda_1, \ldots, \lambda_D)$ By definition these are column vectors, and satisfy $$Z(E) z_i = \lambda_i z_i. \qquad (8)$$

The eigenvectors and associated eigenvalues may be found by any chosen method of numerical linear algebra; consult reference William H. Press, Saul A. Teukolsky, William T. Vetterling, and Brian P. Flannery, *Numerical Recipes in C++: The Art of Scientific Computing*, Cambridge University Press, second edition, 2002, for details.

Now form a matrix S, the rows of which are transposed eigenvectors, thus $$S = \begin{bmatrix} -z_1^t- \\ -z_2^t- \\ \vdots \\ -z_D^t- \end{bmatrix} \text{ or equivalantly } S^t = \begin{bmatrix} | & | & & | \\ z_1 & z_2 & \cdots & z_D \\ | & | & & | \end{bmatrix}. \qquad (9)$$

The lines are intended to suggest the direction in which the vectors extend within the matrix.

We proceed to compute the matrix $Z(E)S^t$; by the definition of matrix multiplication we have $$Z(E)S^t = \begin{bmatrix} | & | & & | \\ Z(E)z_1 & Z(E)z_2 & \cdots & Z(E)z_D \\ | & | & & | \end{bmatrix} = \begin{bmatrix} | & | & & | \\ \lambda_1 z_1 & \lambda_2 z_2 & \cdots & \lambda_D z_D \\ | & | & & | \end{bmatrix} \qquad (10)$$

where the second equality follows from (8).

The eigenvectors are orthonormal, that is it $z_i^t z_j = 1$ if i=j, and 0 otherwise.

Hence $$SZ(E)S^t = \begin{bmatrix} -z_1^t- \\ -z_2^t- \\ \vdots \\ -z_D^t- \end{bmatrix} \begin{bmatrix} | & | & & | \\ \lambda_1 z_1 & \lambda_2 z_2 & \cdots & \lambda_D z_D \\ | & | & & | \end{bmatrix} \qquad (11)$$

$$= \begin{bmatrix} \lambda_1 & & & \\ & \lambda_2 & & \\ & & \ddots & \\ & & & \lambda_D \end{bmatrix}.$$

In other words, the result is a matrix with the associated eigenvalues appearing in order on the diagonal, and zeros everywhere else. Let us write $\Lambda$ for the rightmost matrix in the preceding equation, and likewise $$\Lambda^{-\frac{1}{2}}$$

for diag $(\lambda_1^{-1/2}, \ldots, \lambda_D^{-1/2})$. Both matrices are symmetric and diagonal; it is evident that $$\Lambda^{-\frac{1}{2}} \Lambda (\Lambda^{-\frac{1}{2}})^t = I,$$

the D×D identity matrix.

This leads us directly to the transform that we desire, as follows. Multiplying both the left most and right most expressions in (11) on the left by $$\Lambda^{-\frac{1}{2}}$$

and on the right by $$(\Lambda^{-\frac{1}{2}})^t,$$

we have $$\Lambda^{-\frac{1}{2}} S Z(E) S^t (\Lambda^{-\frac{1}{2}})^t = \Lambda^{-\frac{1}{2}} \Lambda (\Lambda^{-\frac{1}{2}})^t = I. \qquad (12)$$

(Here the final equality follows by simply working out the product of the three indicated matrices.) Substituting the definition of Z(E) from (7) in this yields $$I = \Lambda^{-\frac{1}{2}} S Z(E) S^t (\Lambda^{-\frac{1}{2}})^t \qquad (13)$$

$$= \Lambda^{-\frac{1}{2}} S \left( \frac{1}{E} \sum_{v \in E} v \otimes v^t \right) S^t (\Lambda^{-\frac{1}{2}})^t \qquad (14)$$

$$= \frac{1}{E} \sum_{v \in E} (\Lambda^{-\frac{1}{2}} S v) \otimes (v^t S^t (\Lambda^{-\frac{1}{2}})^t) \qquad (15)$$

$$= \frac{1}{E} \sum_{v \in E} (\Lambda^{-\frac{1}{2}} S v) \otimes (\Lambda^{-\frac{1}{2}} S v)^t \qquad (16)$$

where the last equality follows from the identity $(AB)^t = B^t A^t$, for any matrices conformable for multiplication. (See Howard Anton, *Elementary Linear Algebra*, John Wiley and Sons, 1973; page 68 property iv.)

Now set $$T = \Lambda^{-\frac{1}{2}} S, \qquad (17)$$

and let u=TE as at the start of this section. Note that u and E have the same number of elements; we write u=|u|=|E|=E. Moreover, u also has zero mean:

$$\frac{1}{U}\sum_{u\in U} u = \frac{1}{U}\sum_{v\in E} Tv = T\left(\frac{1}{E}\sum_{v\in E} v\right) = T(0) = 0, \qquad (18)$$

because T is a linear transformation, and E has zero mean. Picking up from (16), it is evident that $$I = \frac{1}{E}\sum_{v\in E}\left(\Lambda^{-\frac{1}{2}}Sv\right)\otimes\left(\Lambda^{-\frac{1}{2}}Sv\right)^t = \frac{1}{E}\sum_{v\in E}(Tv)\otimes(Tv)^t = \frac{1}{U}\sum_{u\in U} u\otimes u^t \qquad (19)$$

because the left most sum combines outer products formed from transformed elements of E, and the right most combines these same outer products, formed from the same transformed elements. Comparing the right most expression in (19) with (7), we see that it is Z(u):, the covariance of the zero-mean data series u. Thus, applying T to each element of E yields a data set that has I as its covariance matrix, and so T is the transform we seek.

Degenerate Cases

One will have noticed that while we are assured, because Z(E) is positive-semidefinite, that each $\lambda_i \geq 0$, these inequalities are not guaranteed to be strict. That is, the possibility exists that $\lambda_i$ is zero, for one or more values of i. This would apparently foil the method discussed here because it would be impossible to form $\Lambda^{-1/2}$.

In fact, the exact opposite is true. For if some $\lambda_i=0$, this means that every vector in E, and by extension every vector encountered in deployment, because E is assumed to be exemplary, is orthogonal to the corresponding eigenvector $z_i$. Hence, the data to be compressed all lie in a D-1-dimensional hyperplane. We may therefore project all the data into an appropriate D-1-dimensional space (specifically, the hyperplane orthogonal to $z_i$), and proceed to apply our method to the resulting data set. This yields even higher compression because only D-1 bits are transmitted for each vector processed. If more than one eigenvalue is zero, this procedure can be iterated until only non-zero eigenvalues remain.

Efficient Joint Representation of T and $T^{-1}$

The matrix $T^{-1}$ is needed to perform the decompression step; it is also needed for so-called closed-loop compression, a technique that is commonly used in conjunction with lossy data compression methods. Storing both T and $T^{-1}$ explicitly requires $2 \cdot D^2 \cdot F$ bits, where F is the number of bits per matrix entry. While this is vastly smaller than a typical vector quantization codebook, it could still consume a significant amount of memory.

For this reason, we now describe a method that exploits the algebraic form of T and $T^{-1}$ to represent both matrices, but which yields a memory reduction, by approximately a factor of two, over storing the two matrices explicitly. There is a small increase in program size and computation associated with this method. However, it is an effective way of trading memory cost for compute cost.

To begin we establish the form of $T^{-1}$. From equation (17) above we have $T=\Lambda^{-1/2}S$. It follows (see Howard Anton, *Elementary Linear Algebra*, John Wiley and Sons, 1973; Theorem 1.6) that $T^{-1}=S^{-1}(\Lambda^{-1/2})^{-1}$. A simple calculation shows that $ss^t=I$, because S is a matrix of orthonormal eigenvectors, and so $S^{-1}=S^t$. Moreover, if we define $\Lambda^{1/2}$=diag $(\lambda_1^{1/2},\ldots,\lambda_D^{1/2})$, it is clear that $\Lambda^{-1/2}\Lambda^{1/2}=I$, and so $(\Lambda^{-1/2})^{-1}=\Lambda^{1/2}$. Hence $$T^{-1} = S^t \Lambda^{\frac{1}{2}}. \qquad (20)$$

Thus, from equations (17) and (20), the actions of both T and $T^{-1}$ on any vector may be computed from the entries of S, $\Lambda^{-1/2}$ and $\Lambda^{1/2}$ alone.

This means that it suffices to store only these latter three matrices, at a cost of $(D^2+2D)\cdot F$ bits of memory. This follows because each diagonal matrix can be represented by only its D non-zero elements. Moreover, if necessary either one of the diagonal matrices may be dispensed with, because the corresponding diagonal elements are just reciprocals of one another; this further reduces the cost to $(D^2+D)\cdot F$ bits.

Finding the Optimal Radius Vector

In this section we explain how to find the radius vector $\bar{\alpha}$ for the optimal D-hypercube codebook. This is determined by analysis of u=TE, the collection of transformed example data. The radius vector $\bar{\alpha}$ we obtain is optimal in the sense that it yields minimal mean square coding distortion, among all D-hypercube codebooks, for this data. Note that $\bar{\alpha}$ is a D-dimensional vector, defined by its elements $\alpha_1,K,\alpha_D$. We refer to $\bar{\alpha}$ as the optimal radius vector.

It will be useful to define the following helper function $\zeta: \mathbb{R} \to \{-1,+1\}$:

$$\zeta(x) = \begin{cases} \frac{|x|}{x} & \text{if } x \neq 0 \\ 1 & \text{otherwise.} \end{cases} \qquad (21)$$

In words, $\zeta(x)$ is 1 if x is positive or 0, and −1 if x is negative. Two properties of $\zeta$, which are both true for all $x \in \mathbb{R}$, are $$x\zeta(x)=|x| \qquad (22)$$

$$\zeta(x)\zeta(x)=1. \qquad (23)$$

Now suppose $\kappa(\bar{\alpha})$ is a D-hypercube codebook, with radius vector $\bar{\alpha}$. For any given $v \in u$, the closest code point in $\kappa(\bar{\alpha})$ is $$\tilde{u} = \daleth^{\kappa(\bar{\alpha})}(u) = \langle \alpha_1\zeta(u_1), \alpha_2\zeta(u_2), \ldots, \alpha_D\zeta(u_D) \rangle. \qquad (24)$$

We seek to adjust $\bar{\alpha}$ to minimize the average coding distortion $\Delta$ of the example set u, defined as $$\Delta(\bar{\alpha}) = \frac{1}{U}\sum_{u\in U}\|\tilde{u}-u\|^2 \qquad (25)$$

$$= \frac{1}{U}\sum_{u\in U}\|\daleth^{\kappa(\bar{\alpha})}(u)-u\|^2 \qquad (26)$$

-continued $$= \frac{1}{U} \sum_{u \in \bigcup} \left( \sum_{j=1}^{D} (\alpha_j \zeta(u_j) - u_j)^2 \right). \quad (27)$$

Note that the norm used in equation (26) is the standard Euclidean metric, computed in the transformed space. We will have more to say about this point below. Differentiating this quantity with respect to each element $\alpha_i$ of $\bar{\alpha}$, we have $$\frac{\partial \Delta}{\partial \alpha_i} = \frac{1}{U} \sum_{u \in \bigcup} \left( \sum_{j=1}^{D} 2(\alpha_j \zeta(u_j) - u_j) \zeta(u_j) \frac{\partial \alpha_j}{\partial \alpha_i} \right). \quad (28)$$

But $\partial \alpha_j / \partial \alpha_i$ is 0 unless i=j, in which case it is 1. Hence the inner sum collapses to the j=i term only, and we are left with $$\frac{\partial \Delta}{\partial \alpha_i} = \frac{1}{U} \sum_{u \in \bigcup} (2(\alpha_i \zeta(u_i) - u_i) \zeta(u_i)) = 0 \quad (29)$$

which we have equated to 0 as the condition for optimality. Multiplying by U/2 to clear the constants, and transposing subtracted terms to the right hand side, we have equivalently $$\alpha_i \sum_{u \in \bigcup} \zeta(u_i) \zeta(u_i) = \sum_{u \in \bigcup} u_i \zeta(u_i), \quad (30)$$

where we have exploited the fact that $\alpha_i$ is a constant with respect to the left hand summation, and can be moved outside it. But as previously noted, $\zeta(u_i)\zeta(u_i)=1$ and $u_i\zeta(u_i)=|u_i|$. Hence we have $$\alpha_i \sum_{u \in \bigcup} 1 = \sum_{u \in \bigcup} |u_i|. \quad (31)$$

But the left hand sum is the result of adding together U copies of 1, and hence itself equals U. Dividing through by U, this leaves us with $$\alpha_i = \frac{1}{U} \sum_{u \in \bigcup} |u_i|. \quad (32)$$

for each i=1, ..., D. This defines the optimal D-hypercube codebook. The asymptotic cost of this algorithm is determined as follows. We assume that the symmetrizing transform T and the transformed example set u=TE have already been determined. Thus u is a set of U=|u|=|E| vectors; each vector comprising D dimensions. There are D elements of the optimal radius vector $\bar{\alpha}$; each element determined by an appropriate instance of equation (32).

A single instance of equation (32) requires U applications of the absolute value function, U-1 additions, and a single division; thus its asypmtotic cost is O(U)+O(U-1)+O(1)=O (U) operations. Since $\bar{\alpha}$ is completely determined by D applications of (32), the asymptotic cost of the algorithm is O(D U).

It is worth noting that this cost is dominated by the cost of determining u. For each vector u∈u is obtained from some corresponding v in E by a matrix multiplication, u=Tv. The cost of this multiplication is $O(D^2)$, since each element of u is determined by D multiplications and D-1 additions, comprising O(D) arithmetic operations, and there are D elements of u to compute. Therefore the asymptotic cost of forming u is $O(D^2 U)$ operations.

The cost of finding the symmetrizing transform T depends upon the algorithm used. A typical algorithm for finding T is the method of Jacobi rotations, described in William H. Press, Saul A. Teukolsky, William T. Vetterling, and Brian P. Flannery, *Numerical Recipes in C++: The Art of Scientific Computing*, Cambridge University Press, second edition, 2002, Section 11.1. The asymptotic cost of this method is $O(D^3)$, though because it is an iterative algorithm, its exact running time is data dependent. Thus, even with the generation of u and T figured in, the D-optimal hypercube algorithm costs no more than $O(D^2 (U+D))$ operations, which is polynomial in both D and U.

Note that the procedure discussed here determines a full D-hypercube codebook, which implicitly defines $2^D$ code points. By comparison, the K-means algorithm of FIG. 2 has an asymptotic cost of at least $O(U D 2^D)$ operations to create a codebook of equal size (that is, with $K=2^D$). This is because the K-means algorithm must explicitly compute and record each of the $2^D$ code points, and compare each element of E (which contains U vectors, since |E|=|u|) with each candidate code point.

We can compare the efficiency of the two approaches by examining the ratio of their asymptotic costs when computing equal-sized codebooks; that is, (cost of K-means algorithm)/(cost of optimal radius vector algorithm).

This ratio is $(U D 2^D)/(D^2 (U+D))$. Since this function grows exponentially with D, the optimal radius vector algorithm is exponentially more efficient than the K-means algorithm, when creating codebooks of equal size.

Compression and Decompression

With the necessary machinery now all in place, we can present complete compression and decompression algorithms.

Basic Algorithms

We assume that, following the procedures given in the preceding two sections, we have analyzed the example set E to determine T and $T^{-1}$, and found an associated D-hypercube codebook, with radius vector $\bar{\alpha}$.

To clarify the discussion, we define a few "helper" functions as follows. The first is the "mark-negative" function $m(x): \mathbb{R} \to \{0, 1\}$, defined as $$m(x) = \begin{cases} 0 & \text{if } x \geq 0 \\ 1 & \text{otherwise} \end{cases}. \quad (33)$$

In other words, m attains the value 1 if its argument is negative, and 0 if its argument is zero or positive.

We also define a family of bit-extraction-and-selection functions $b_j(n,\rho)$, where n is a non-negative integer, and $\rho$ is an arbitrary real number, by $$b_j(n, p) = \begin{cases} \rho & \text{if the } j\text{th binary digit of } n \text{ is } 0 \\ -\rho & \text{otherwise} \end{cases} \quad (34)$$

Here bits are numbered with bit 0 as the least significant bit of n.

The algorithms for compression and decompression are given in FIGS. 11 and 12 respectively.

FIG. 11 shows an algorithm to compress a vector v. T is the symmetrizing transform. The function m(x) is defined herein. This algorithm implicitly defines the compression function $g^{\kappa(\overline{\alpha}),T}$, though the codebook is nowhere explicitly constructed or searched.

FIG. 12 shows an algorithm to decompress an index i. The functions $b_j(n,\rho)$ are defined herein. The matrix $T^{-1}$ is the inverse of the symmetrizing transform, given by equation (20). This algorithm implicitly defines the decompression function $h^{\kappa(\overline{\alpha}),T}$, although the codebook is nowhere explicitly constructed or consulted. Alternately, i can be reduced to a table lookup operation, if the receiver codebook cost is not a concern.

Metric Considerations

We return now to the question of the metric in the compression equation. It should be apparent from the discussion to this point that the method operates in the transformed space $T(\mathbb{R}^D)$. Because T is by assumption of full rank $T(\mathbb{R}^D)$ is $\mathbb{R}^D$ itself. Our intention is to underscore that when compressing a given vector v, we will apply the compression function $g^{\kappa(\overline{\alpha})}$ to u=Tv. This function, as implicitly defined by the discussion elsewhere herein, selects the closest code point in $\kappa(\overline{\alpha})$ with respect to the Euclidean norm in the transformed space. As we now show, this corresponds to using the Mahalanobis norm, computed with respect to the covariance matrix Z(E), in the untransformed space. A discussion of the Mahalanobis norm, which is the natural one for abstract vector data, that is, vectors not derived from coordinate measurements in a Euclidean space, may be found in Richard O. Duda, Peter E. Hart, and David G. Stork, *Pattern Classification*, John Wiley and Sons, New York, N.Y., second edition.

We proceed to establish the desired result regarding the Mahalanobis norm. To begin, note that the (squared) Euclidean distance $d^2(u,w)$ between two vectors u=Tv and w=Ts in $T(\mathbb{R}^D)$ is given by $$d^2(u,w) = \|u-w\|^2 = (u-w)^t(u-w). \quad (39)$$

Because T is a linear transform, we have (u−w)=(Tv−Ts)=T(v−s), and hence we may write $$d^2(u, w) = (u-w)^t(u-w) \quad (40)$$

$$= (T(v-s))^t T(v-s) \quad (41)$$

$$= \left(\Lambda^{-\frac{1}{2}} S(v-s)\right)^t \left(\Lambda^{-\frac{1}{2}} S(v-s)\right) \quad (42)$$

$$= (v-s)^t S^t \Lambda^{-1} S(v-s). \quad (43)$$

Now equation (11) above may be written more succinctly as $SZ(E)S^t = \Lambda$, from which $$Z(E) = S^t \Lambda S_1 \quad (44)$$

where we have used the fact that $S^{-1} = S^t$, demonstrated above. Now Z(E) is an invertible matrix, so inverting both sides of (44), we have $$Z(E)^{-1} = (S^t \Lambda S)^{-1} = S^{-1} \Lambda^{-1} (S^t)^{-1} = S^t \Lambda^{-1} S. \quad (45)$$

Substituting in (43) above, we have $$\|u-w\|^2 = (v-s)^t Z(E)^{-1}(v-s), \quad (46)$$

which is the Mahalanobis norm in the original space, with respect to the covariance matrix Z(E).

Enhancements

In this section we explain a series of enhancements of the basic method, which reduce the coding distortion. The development proceeds in three parts.

We first explain the rotation method. This is a refinement of the basic method, which may reduce distortion, but is not guaranteed to do so. A key advantage of this enhancement is that the method, while requiring either no increase, or only a very modest increase, in the memory and computation requirements of the compression system, and with no increase in the size of the compressed data (or equivalently, the bandwidth needed to transmit the compressed data), can reduce the coding distortion.

Next, we explain the multiple hypercube method. This is likewise a refinement of the basic method, which is guaranteed to reduce the coding distortion, unless the distortion is zero. However, this method, which is based upon augmenting the (virtual) codebook, does increase the system's memory, bandwidth and computation requirements. Fortunately, as we will demonstrate, these all grow very slowly—only logarithmically with the total number of hypercube code points.

Finally, we explain the alternating search method, which combines these two techniques, and can offer still lower distortion.

Each method has various associated algorithms, for compression and decompression, and for determination of various parameters that appear in the method, which are explained in detail below. These algorithms are novel and constitute part of the invention.

The Rotation Method

In developing the fundamental idea that underlies our method above, we used a symmetry argument to establish the following: if the data to be compressed are uniformly distributed within a sphere, there is no preferred orientation to a hypercube codebook $\kappa(\overline{\alpha})$, in the sense of yielding a lower average distortion. This frees us to choose an orientation that makes i especially easy to compute the compression function $g^{\kappa(\overline{\alpha})}$.

While correct, this argument depends upon the unrealistic assumption that the distribution of data to be compressed, even after application of the symmetrizing transform T, will in fact be spherically symmetric. Thus, the question arises if rotating the hypercube codebook can lower the distortion. The answer to this question is yes, as we proceed to demonstrate in this section, and then systematically exploit.

The rotated hypercube codebook will no longer be perfect—that is, the boundaries of the hypercube's associated Voronoi diagram, which are necessarily hyperplanes that are mutually orthogonal to one another, will no longer be orthogonal to the axes of the natural coordinate system of $\mathbb{R}^D$. Because it is this property that permits the extremely efficient computation of the compression function $g^{\kappa(\overline{\alpha})}$, using any other orientation would seem to eliminate the method's key advantage. But as we shall demonstrate shortly, in fact it is possible to accommodate a hypercube of arbitrary orientation, with no impact on the method's computational efficiency or memory usage.

Motivating Example

In this section we motivate the idea of rotating the hypercube codebook. This is done by exhibiting an example data set E, computing its symmetrizing transform T, finding the optimal radius vector $\bar{\alpha}$ for the transformed data set TE, and then explicitly showing that rotating the hypercube codebook $\kappa(\bar{\alpha})$ can substantially lower the distortion.

Figure 13A:
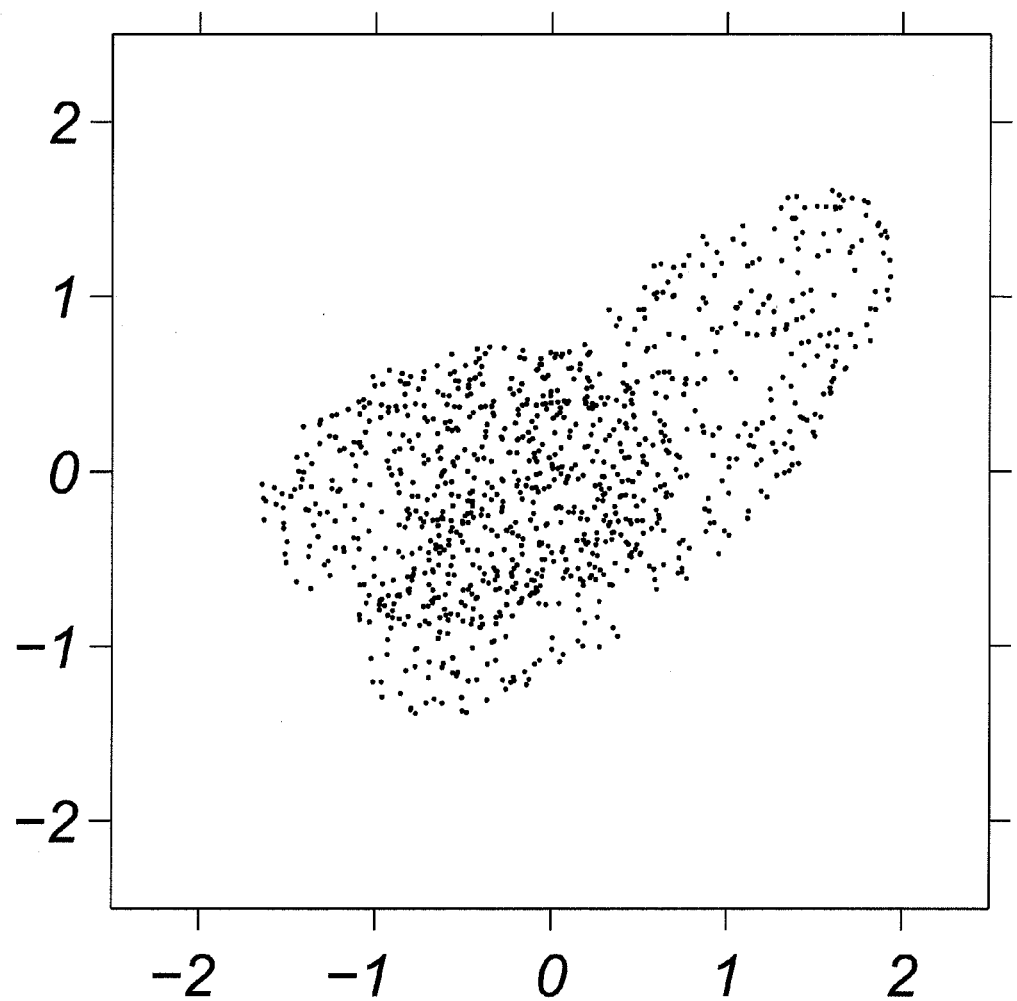
FIGS. 13a and 13b show data with no particular symmetry, where
Figure 13B:
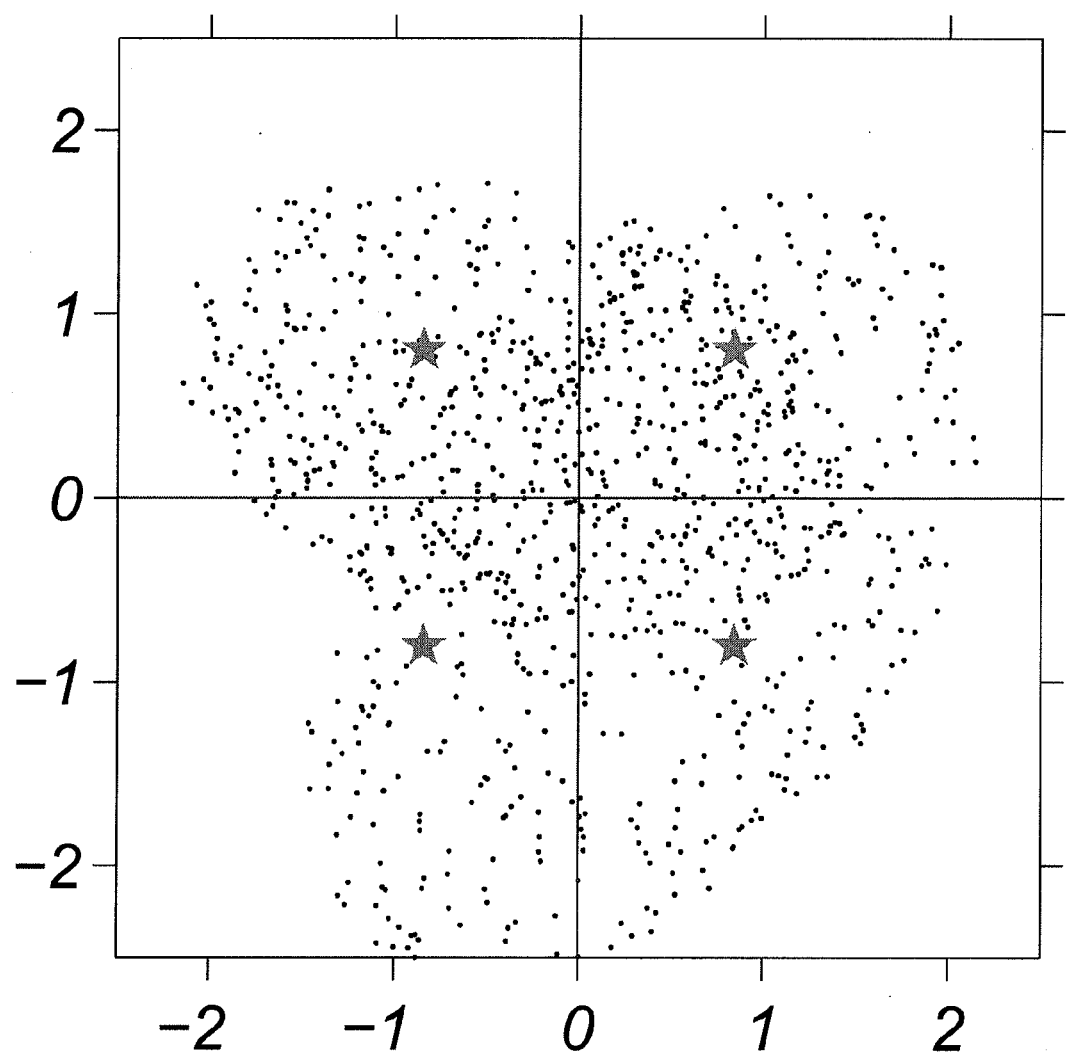

FIGS. 13a and 13b exhibit such an example. The starting data set E, displayed in FIG. 13a, has no particular symmetry. Following the procedures above, we find the zero-mean and symmetrizing transforms, yielding TE, displayed in FIG. 13b. Not surprisingly, TE has a more spherical appearance to the eye; moreover by construction its covariance matrix is the identity.

We proceed to compute the optimal radius vector $\bar{\alpha}$ for TE, by the method above; by construction the resulting hypercube codebook $\kappa(\bar{\alpha})$ is perfect. For the data in FIGS. 13a and 13b, we obtain $\bar{\alpha}=<0.8431,0.8041>$; this yields an average coding distortion for TE of 0.6405 squared distortion units per element. FIG. 13b shows the vertices of $\kappa(\bar{\alpha})$. and the associated Voronoi boundaries.

To demonstrate the dependence of the coding distortion upon the orientation of the hypercube, we explicitly rotate the hypercube through the range $[-\pi/2,\pi/2]$, computing the average coding distortion of TE for each orientation considered. It is not necessary to search the nominal full rotation space, of $\theta\in[-\pi,\pi]$, due to the symmetry of the hypercube: rotating it about its center through exactly $\pi$ radians, in any plane that is parallel to any of the hypercube faces, changes the indices of the code points, but not their locations. Thus a clockwise rotation by $\theta$ radians, where $\theta\in[\pi/2,\pi]$, is equivalent to a rotation by $\theta-\pi$ radians, where the latter quantity lies in $[-\pi/2,0]$. Thus, the interval $[\pi/2,\pi]$ need not be examined, and likewise for the interval $[-\pi,-\pi/2]$; it suffices to search $[-\pi/2,\pi/2]$.

Figure 14:
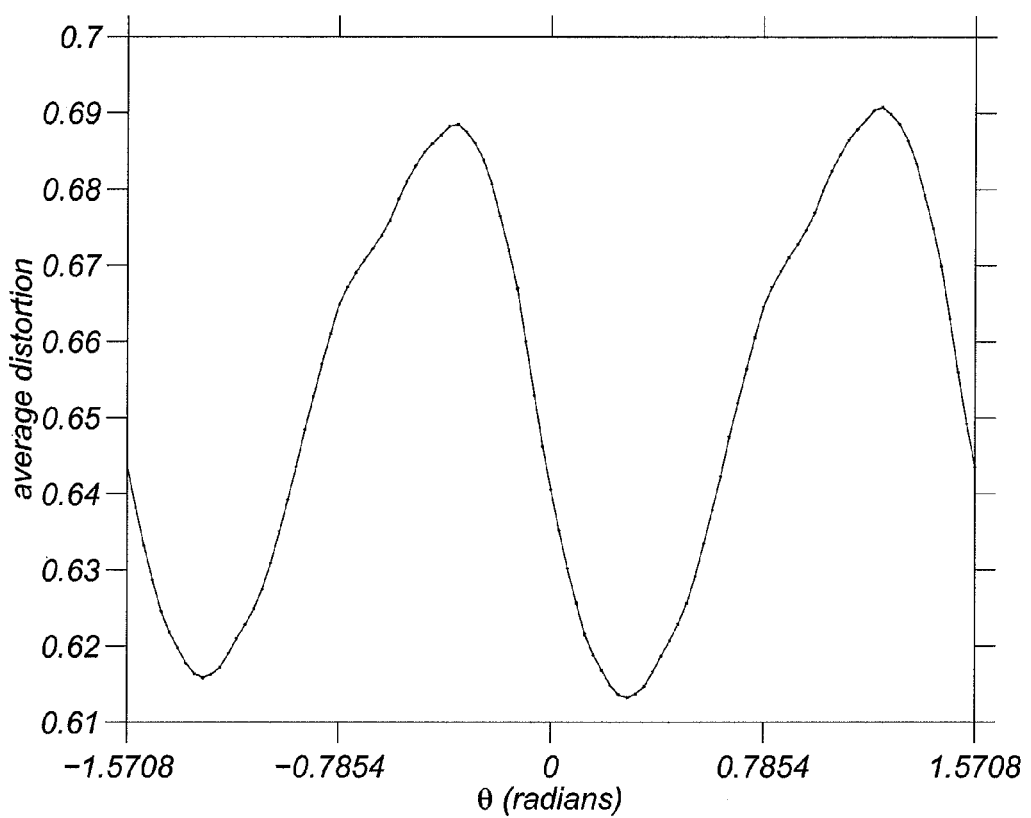
FIG. 14 shows a per-element distortion vs. hypercube rotation angle.
Figure 15A:
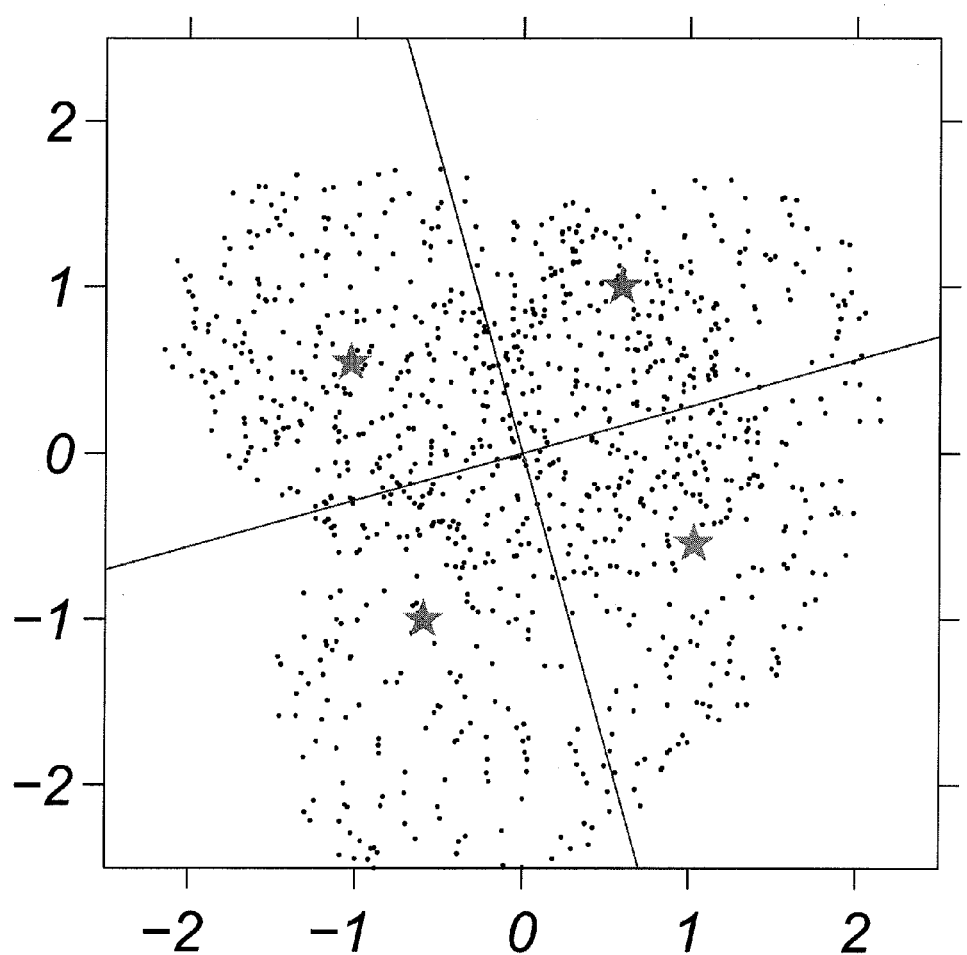
FIGS. 15a and 15b show rotation of a hypercube; equivalent rotation of data, where

The resulting data are graphed in FIG. 14, which shows a per-element distortion vs. hypercube rotation angle. Note that the local minimum at about −1 radian is not quite as deep as the true minimum, at about +0.28 radians. The distortion exhibits a total variation of about 11%, from minimum to maximum. By explicit search, we determine that the lowest distortion orientation corresponds to a counterclockwise rotation of the hypercube through $\theta^*=0.2827$ radians. This brings the distortion to 0.6132 squared distortion units per element, a reduction of about 4%, with respect to the unrotated hypercube. The rotated hypercube is depicted in FIG. 15a.

It is worth noting here the following simple but essential duality. With respect to coding distortion, if $\theta^*$ is the optimal rotation of the hypercube, we can just as easily rotate the data by $-\theta^*$. The residual, which is the difference between a vector v and its reconstruction $\tilde{v}=\mathcal{T}(v)$), will be the same length in either case, and hence the distortion will be identical. It is only necessary, in constructing a complete end-to-end data compression system, to incorporate an appropriate rotation of the data to its rotated location in the compression algorithm, and an inverse rotation of the reconstructed vector in the decompression algorithm. As we demonstrate below, both can be accomplished with zero computational or storage overhead.

Figure 15B:
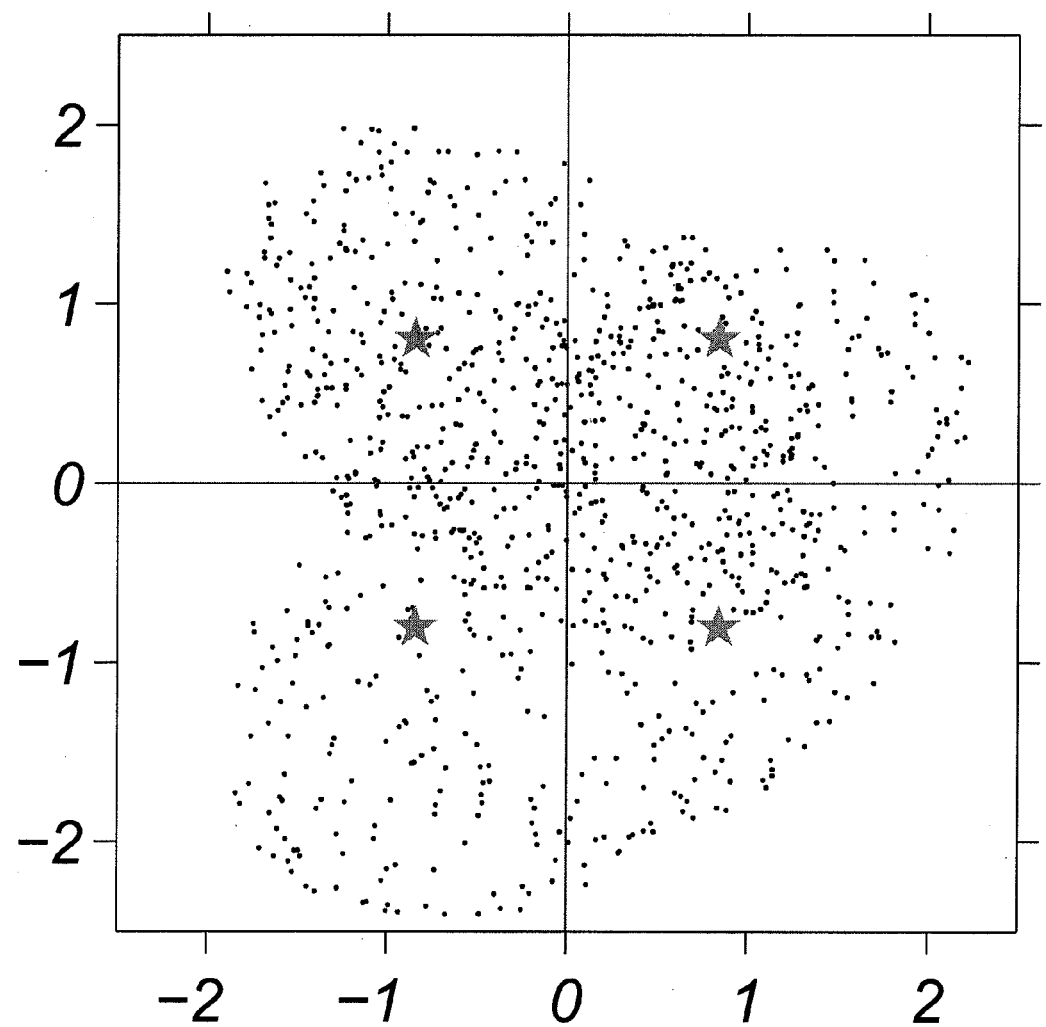

The advantage of rotating the data, as opposed to the hypercube, is that the Voronoi diagram of the unrotated hypercube is perfect, and so we accrue all the advantages of the algorithm already described. FIGS. 15a and 15b show rotation of hypercube; equivalent rotation of data. FIG. 15a shows rotation of $\kappa(\bar{\alpha})$, for $\bar{\alpha}=<0.8431,0.8041>$, through an angle $\theta^*=0.2827$ radians (the optimal rotation); FIG. 15b shows equivalent rotation of data, through an angle $-\theta^*$. Rotation of the data, as opposed to the codebook, is depicted in FIG. 15b. We will discuss this duality further below.

Figure 16:
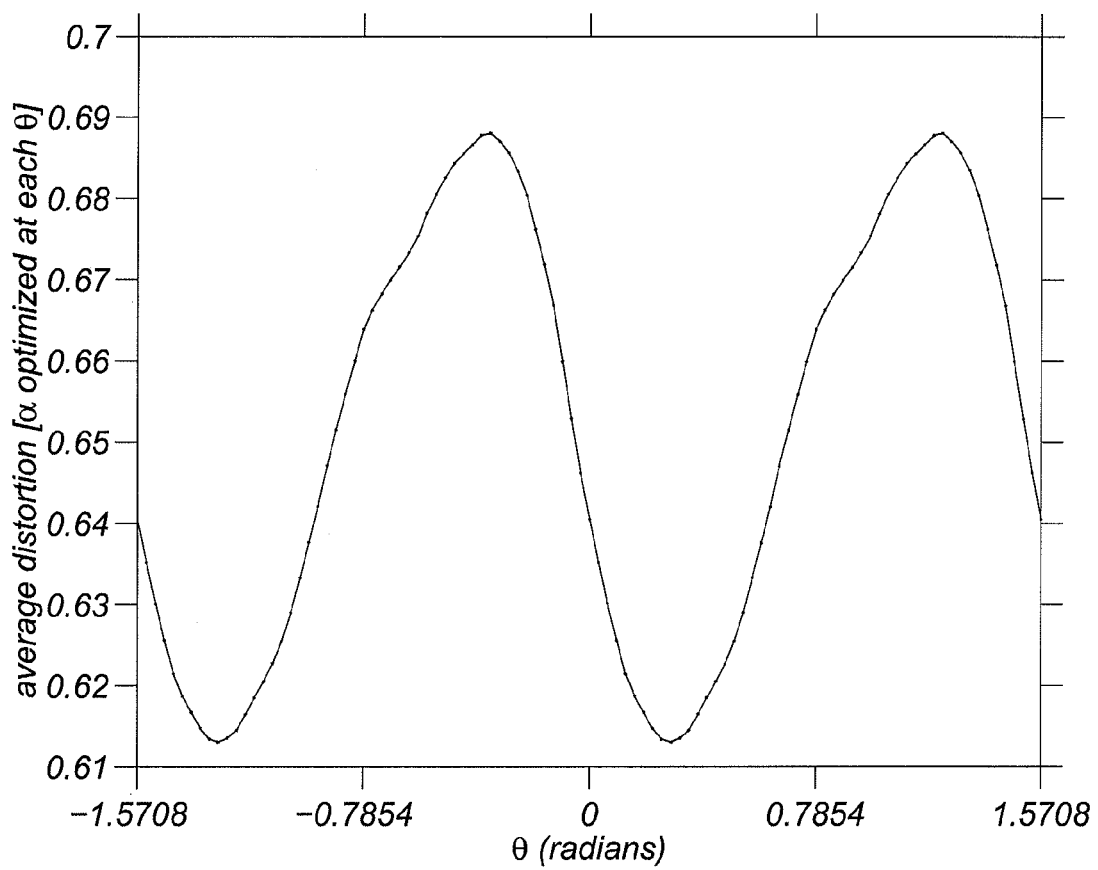
FIG. 16 shows a per-element distortion vs. hypercube rotation angle.

An extension to this idea is to vary not just the orientation of the hypercube, but also the radius vector at a given orientation. There is no reason to expect that the optimal $\bar{\alpha}$ computed for the case of no rotation will remain so at other orientations. This question can be investigated by the same technique that yielded FIG. 14 above, with the addition that at each sampled rotation, the optimal $\bar{\alpha}$ is determined. The resulting graph appears in FIG. 16, which shows a per-element distortion vs. hypercube rotation angle. This graph was prepared with the same data and methods as used in FIG. 14 above, with the exception that the optimal $\bar{\alpha}$ is computed at each orientation. Note that the two minima are of equal depth. At least in this example, the effect is small: the value of $\theta^*$ is unchanged, and the distortion at this rotation drops from 0.6132 to 0.6130 squared distortion units. However, in principle this extension can yield some improvement, and so we record it here.

Implementation of the Rotation Method

When implementing the rotation method, the desired rotation R, which nominally follows the symmetrizing transform T, may be incorporated into T. That is, instead of compressing the symmetrized vector u=Tv, where T is the symmetrizing transform discussed earlier, the compression takes place on a rotated, symmetrized vector u=RTv. This equation nominally denotes two operations: multiplying the vector v by the matrix T, and then multiplying the result of that computation by another matrix R. This second multiplication nominally requires both additional storage and computation.

However, by forming a single matrix product M=RT in advance of performing any compression, and then compressing by the basic method a rotated, symmetrized vector u=Mv, the desired reduction in distortion can be achieved with no increase in memory, computation or bandwidth. This is because the memory associated with separately representing matrices R and T has now been coalesced in representing the single matrix M=RT, at the same cost as representing T alone in the basic method. Likewise, the computation associated with separately performing the multiplication by T followed by the multiplication by R has now been coalesced in multiplication by a single matrix M, at the same cost as multiplying by T alone in the basic method.

Finding and transmitting the index of the closed hypercube vertex to the vector u=Mv, proceeds exactly as in the basic method, and hence the cost associated with those steps is unchanged.

The order of rotation and symmetrization may be interchanged, though the actual rotation and symmetrizing transform applied may therefore be different.

The Multiple Hypercubes Method

In this section we describe a method that is guaranteed to lower the expected average coding distortion, providing it is not already zero. Unlike the rotation method of the preceding section, this technique does increase the system memory and computation requirements, as well as the upstream bandwidth.

The idea of the method can be described in a single sentence: to decrease the distortion, increase the number of code points, by increasing the number of hypercubes. This requires memory to store the additional hypercube radius vectors, and also forces us to add an explicit distance computation to the compression algorithm. However, the rate of growth of the additional memory and computation requirements is exceedingly small, compared to the rate at which additional code points are added; specifically, they grow only logarithmically with the effective size of the codebook.

This discussion is organized as follows:

First, we describe the method, and supply the compression and decompression algorithms.

Then we show how it guarantees to lower the average coding distortion, and also demonstrate that it requires only logarithmically growing memory and computation resources.

Finally, we describe an efficient algorithm for finding a family of hypercube codebooks that may be used in the method.

Description and Basic Algorithms

The method works as follows. Instead of compressing and decompressing with a single D-hypercube codebook $\kappa(\overline{\alpha})$, the vertices of which are determined by a single radius vector $\overline{\alpha}$, compression and decompression take place with respect to a family of K distinct D-hypercube codebooks, defined by the set $A=\{\overline{\alpha}^1, \overline{\alpha}^2, \ldots, \overline{\alpha}^K\}$ of their associated radius vectors. Note that the total number of (implicit) code points associated with the set A is $K \cdot 2^D$. This follows because each radius vector describes a D-hypercube, each vertex of which is a code point, and there are $2^D$ vertices of a D-hypercube. Because there are more code points, the volume of each finite Voronoi cell is smaller, and hence the average coding distortion is reduced.

Compressing a vector v with respect to a collection of hypercube codebooks requires a slightly more complicated algorithm than the basic one given above. As when compressing with a single hypercube codebook, we begin by applying a symmetrizing transform T, obtaining u=Tv. Likewise as when compressing with a single hypercube codebook, the orthant of the nearest code point to u is known. Specifically, it must be the orthant of u itself, because all the hypercubes are perfect, and hence share the same Voronoi cell structure, which consists of precisely the orthants themselves. However, there are now K distinct hypercube codebooks, each of which has a vertex that lies within the selected orthant. The identity of the closest hypercube vertex within the orthant, among the K possibilities, must be established, and thus a small amount of explicit search is now required for compression.

Anecdotally, the compression algorithm now becomes:
1. Given vector v to compress find u=Tv;
2. Find the orthant of u, encoded as $i=m(u_D)m(u_{D-1}) \ldots m(u_1)$, exactly as in FIG. 11;
3. Find, via explicit search within the orthant, the index k of the closest hypercube $\overline{\alpha}^k \in A$. (The search may also be conducted in the positive orthant, by mapping the transformed vector u into this orthant, via the map p defined below, and conducting the search for the index k of the closest hypercube among the vertices in the positive orthant. The result will be identical.)

The result of this search, along with the identity i of the orthant, must be transmitted to the receiver; hence the requirement for slightly greater upstream bandwidth. To decompress, the receiver uses the index k to select the appropriate hypercube radius vector $\overline{\alpha}^k$. Inspecting the coded orthant i then yields the appropriate vertex of the $\overline{\alpha}^k$ hypercube. This vertex is taken as $\tilde{u}$, from which $\tilde{v}=T^{-1}\tilde{u}$ is computed.

The algorithms for compression and decompression with multiple hypercubes are described in detail in FIGS. 18 and 19 respectively, where FIG. 18 shows an algorithm to compress a vector v with a multiple hypercube method (the function m(x) is defined herein); and where FIG. 19 shows an algorithm to decompress a hypercube, index pair <k−1,i> (the functions $b_j(n,\rho)$ are defined herein).

The descriptions make use of some special nomenclature, detailed here. We define $\mathbb{P}=\mathbb{R} \cap [0,\infty)$, the set of non-negative real numbers; and we refer to the set $\mathbb{P}^D$ as the positive orthant. We define the map $p: \mathbb{R}^D \to \mathbb{P}^D$, for any $<v_1, \ldots, v_D> \in \mathbb{R}^D$, by $$p(<v_1, \ldots, v_D>) = <|v_1|, \ldots, |v_D|>, \quad (47)$$

and the map $\zeta: \mathbb{R}^D \to \mathbb{R}^D$, for any $<v_1, \ldots, v_D> \in \mathbb{R}^D$, by $$\zeta(<v_1, \ldots, v_D>) = <\zeta(v_1), \ldots, \zeta(v_D)>. \quad (48)$$

Given two vectors $v, w \in \mathbb{R}^D$, we define $v \odot w$, their pointwise product, by $$v \odot w = <v_1 w_1, \ldots, v_D w_D>. \quad (49)$$

The composition of the compression and decompression algorithms, operating with respect to the set A of hypercube radius vectors, defines a quantization function $\mathbf{T}^A$. That is, $\mathbf{T}^A$(u) denotes the result of compressing and then decompressing u, with respect to the radius vector set A.

Figure 17:
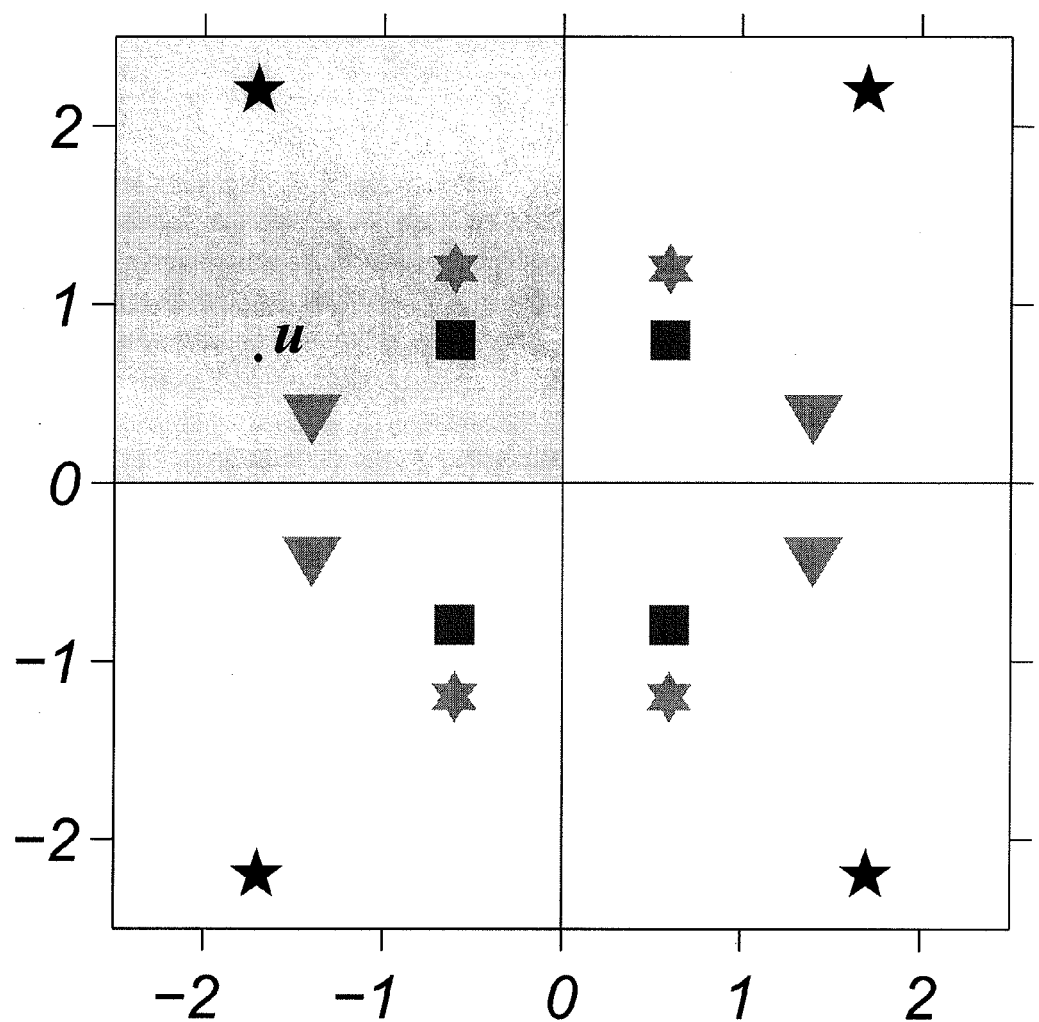
FIG. 17 shows multiple hypercube compression.

The operation of the compression algorithm is depicted graphically in FIG. 17. FIG. 17 shows the orthant of u=Tv shaded; this corresponds to the common Voronoi cell of each of the perfect hypercubes. Thus only the implicit code points within this orthant need be searched to find $\mathbf{T}^A$ (u). The shaded orthant shows the region within which $\mathbf{T}^A$ (u) must lie; hence only these points need be searched explicitly to find the closest code point.

Distortion Reduction; Logarithmic Resource Requirements

We now show that by an appropriate choice of hypercubes, this method can guarantee a reduction in the average expected coding distortion. We use the words "an appropriate choice of hypercubes" advisedly because the technique we will now present, while ensuring a reduction in distortion, is somewhat inefficient. In the discussion below, we describe a superior method of choosing hypercubes, the orthant K-means algorthm. However, the latter method, while offering significant advantages, does not guarantee a reduction in distortion. This point is discussed further, in the development of the latter algorithm.

Let $A=\{\overline{\alpha}^1, \overline{\alpha}^2, \ldots, \overline{\alpha}^K\}$, be the collection of D-hypercube radius vectors, with associated quantization function $\mathbf{T}^A$. Recall that the average coding distortion, with respect to u=TE, the transformed example data set, is $$\Delta(A) = \frac{1}{U} \sum_{u \in U} \|\mathbf{T}^A(u) - u\|^2. \quad (54)$$

Suppose then that $\Delta(A)>0$; then $\exists \hat{u} \in u$ such that $\|\mathbf{T}^A(\hat{u})-\hat{u}\|=\delta_{\hat{u}}>0$. Let $\overline{\alpha}^{K+1}=p(\hat{u})$, and set $A'=A \cup \{\overline{\alpha}^{K+1}\}$. Clearly then $\mathbf{T}^{A'}(\hat{u})=\hat{u}$, and hence $\|\mathbf{T}^{A'}(\hat{u})-\hat{u}\|=0$. Moreover, for any $v \in \mathbb{R}^D$, we have $\|\mathbf{T}^{A'}(v)-v\|^2 \leq \|\mathbf{T}^A(v)-v\|^2$, because $A' \supseteq A$, and hence $\mathbf{T}^{A'}(v)$ either matches $\mathbf{T}^A(v)$, or yields a code point that is closer to v.

Now $\Delta(A)$ may be rewritten as $$\Delta(A) = \frac{1}{U}\left(\sum_{u \in \bar{U}} \|\Gamma^A(u) - u\|^2 + n_{\hat{u}}\|\Gamma^A(\hat{u}) - \hat{u}\|^2\right), \quad (55)$$

where $\bar{u}$ is u with all instances of $\hat{u}$ deleted, and $n_{\hat{u}}$ is the number of times $\hat{u}$ appears in u. (Note that the sigma-denoted sum in (55) proceeds only over the elements of $\bar{u}$.) Likewise $\Delta$ (A') may be written in exactly the same way, but with $\Gamma^A$ replaced by $\Gamma^{A'}$. Then taking the difference of $\Delta(A)$ and $\Delta(A')$, each written this way, we have $$\Delta(A) - \Delta(A') = \frac{1}{U}\left(\sum_{u \in \bar{U}}\left(\|\Gamma^A(u) - u\|^2 - \|\Gamma^{A'}(u) - u\|^2\right) + n_{\hat{u}}\delta_{\hat{u}}^2\right) \quad (56)$$

$$\geq \frac{1}{U} n_{\hat{u}} \delta_{\hat{u}}^2 > 0 \quad (57)$$

The last inequality is strict, and hence $\Delta(A') < \Delta(A)$ as claimed.

The cost of this method, which adjoins $2^D$ (implicitly defined) code points to the codebook, is just the cost of finding a single $u \in u$ that does not correspond to any vector in A, the collection of K distinct D-hypercube radius vectors. This asymptotic cost is O(U D K) operations, the time to search through (at most) an elements of u for a suitable $\hat{u}$.

Though the asymptotic cost is low, this method is inefficient, in that it uses a full hypercube to account for a single element of u, and thereby reduce the coding distortion. No attempt is made to adjust the other vectors in A, or to account for the coding distortion of other elements of u. These shortcomings are remedied by the algorithm of the next section, the orthant K-means algorithm.

The Orthant K-Means Algorithm

We now describe the orthant K-means algorithm, which efficiently finds a collection of K perfect hypercube codebooks that yield low average coding distortion for the transformed example data u=TE. In the text that follows we explain the intuition behind the method. The exact description of the algorithm appears in FIG. 23. This algorithm determines a collection of K distinct D-hypercube codebooks, specified by their radius vectors, that cover the transformed example data set u well. This algorithm is novel and constitutes part of the invention.

We begin by stating the objective. We have already seen how to choose a single perfect D-hypercube codebook that is optimal, with respect to the minimum-distortion criterion, for coding transformed example data u. Now our aim is to find a collection of K>1 perfect D-hypercubes, which when used to code u, further reduce the distortion.

Figure 20A:
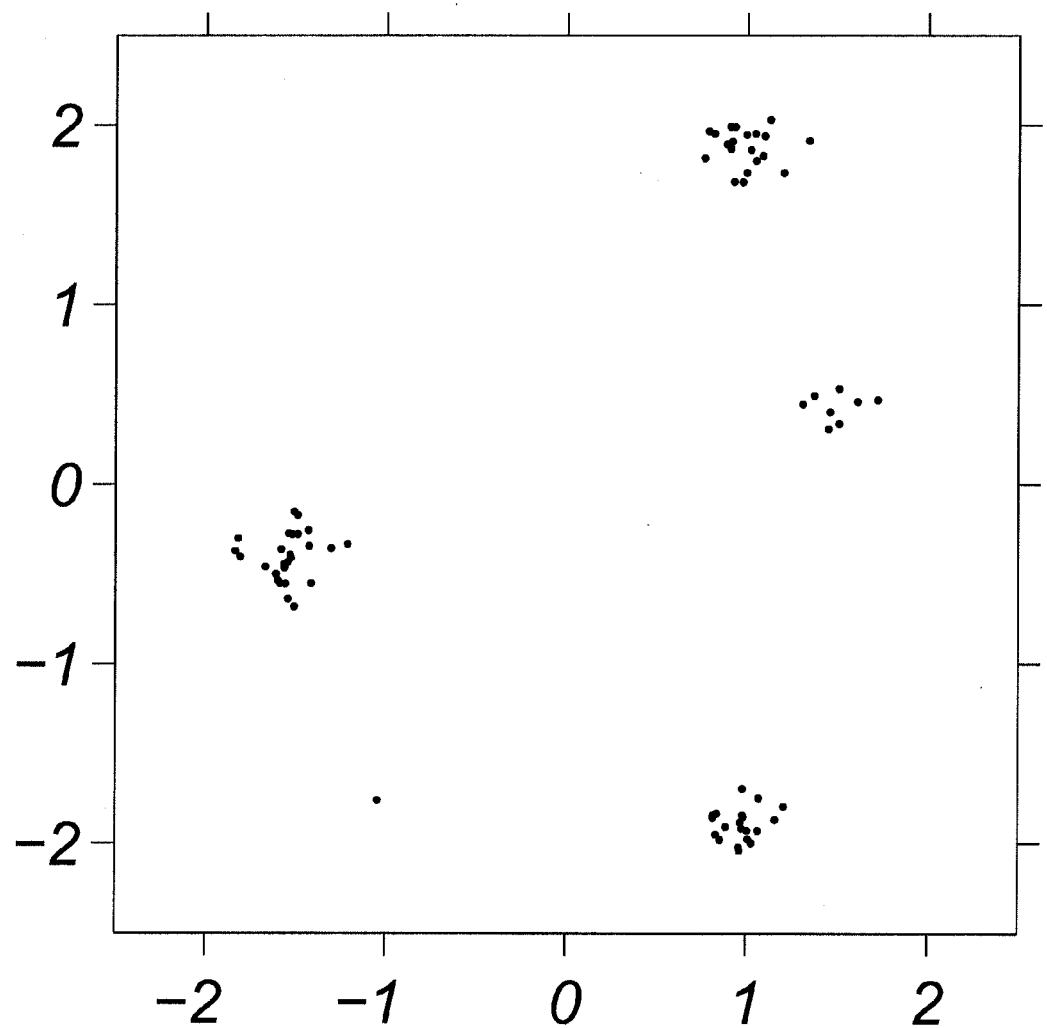
FIGS. 20a and 20b show the effect of a conventional K-means algorithm, where
Figure 20B:
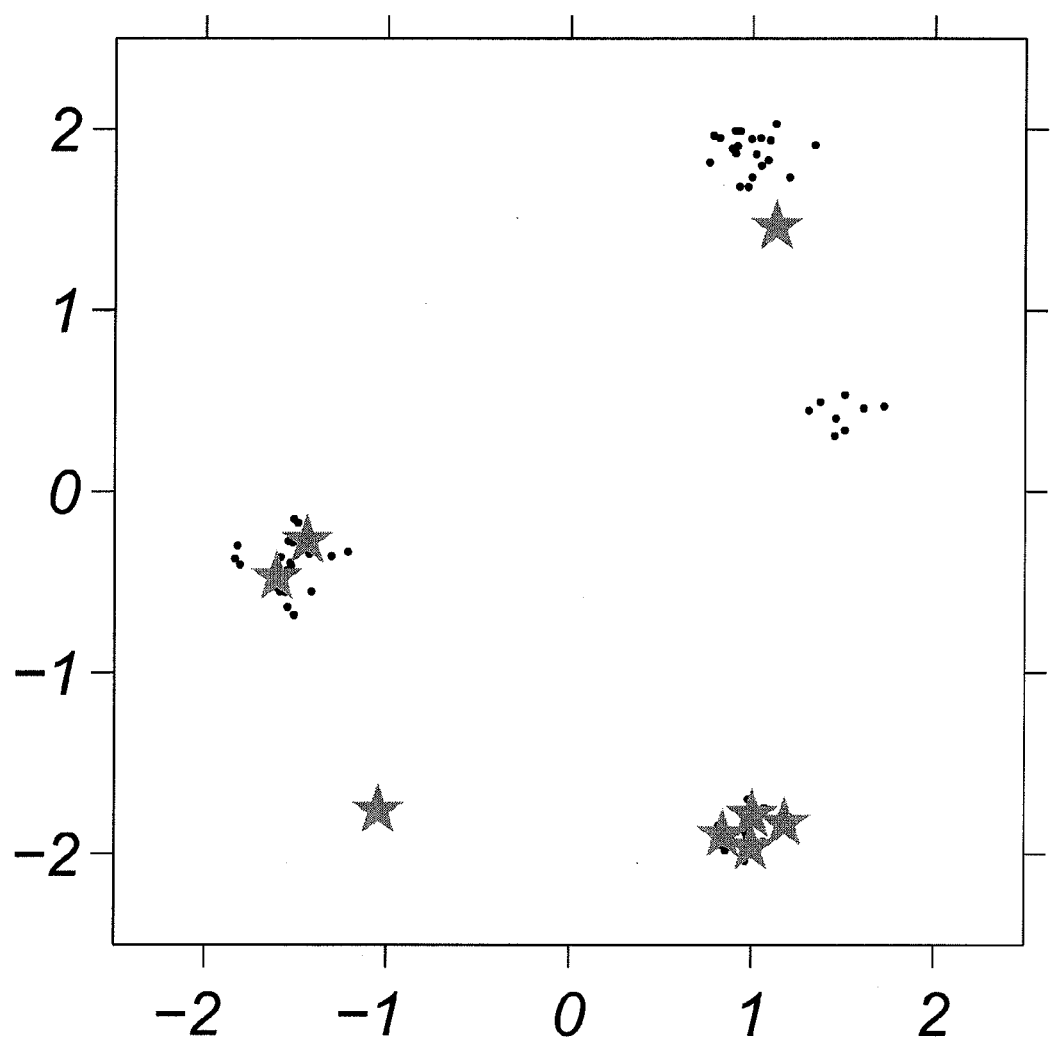

This problem is akin to the one facing the designer of a conventional vector quantization codebook, who will typically use the K-means algorithm, described above in FIG. 2, to establish a set of K codepoints. The problem with that algorithm, for our purposes, is that the codepoints selected will not in general lie at the vertices of perfect hypercubes, even if the number of codepoints sought (that is, the value of K), is an appropriate multiple of a power of 2. This is evident in the example depicted in FIGS. 20a and 20b, which show the effect of applying the conventional K-means algorithm to the data shown, to generate 8 code points. FIGS. 20a and 20b show a conventional K-means algorithm, where FIG. 20a shows transformed example data u, and FIG. 20b shows a result of the K-means algorithm, for K=8.

The obstacle to applying the conventional K-means algorithm is that the code points that it finds are not constrained lie on the vertices of one or more perfect hypercubes. Indeed, it is not immediately obvious how to discover even a single hypercube within the elements of the training data. That is, to find a group of points of u, the elements of which all lie close to the vertices of some perfect hypercube codebook. The property of a point set, that its elements all lie in a hypercube arrangement with respect to one another, is decidedly nonlocal. That is, this is not a property that is discoverable by selecting a point of u, and then examining that point and other elements that lie close to it. The orthant K-means algorithm overcomes this obstacle by exploiting the following observation.

Consider the $2^D$ vertices $\kappa(\bar{\alpha})$ of a perfect hypercube codebook, as defined by equation (6): the i th element of any $\upsilon \in \kappa(\bar{\alpha})$ is either $+\alpha_i$ or $-\alpha_i$, and hence the i th element of p(v) is $\alpha_i$. Thus for any vertex $\upsilon \in \kappa(\bar{\alpha})$, we have $p(v) = \bar{\alpha}$.

This has the following important consequence. Suppose we map the transformed training data into the positive orthant $\mathbb{P}^D$, defining u+=<p(u)|u∈u>. Then dusters in $u_+$ correspond to collections of points in u all of which lie on or near the vertices of the same perfect hypercube. This is evident in FIGS. 20a and 21a, respectively. Here, points in $\mathbb{R}^2$, not evidently distributed to lie on or near perfect 2-hypercube vertices, are seen to fall naturally into two clusters, when mapped by p into the positive orthant $\mathbb{P}^2$.

Figure 21A:
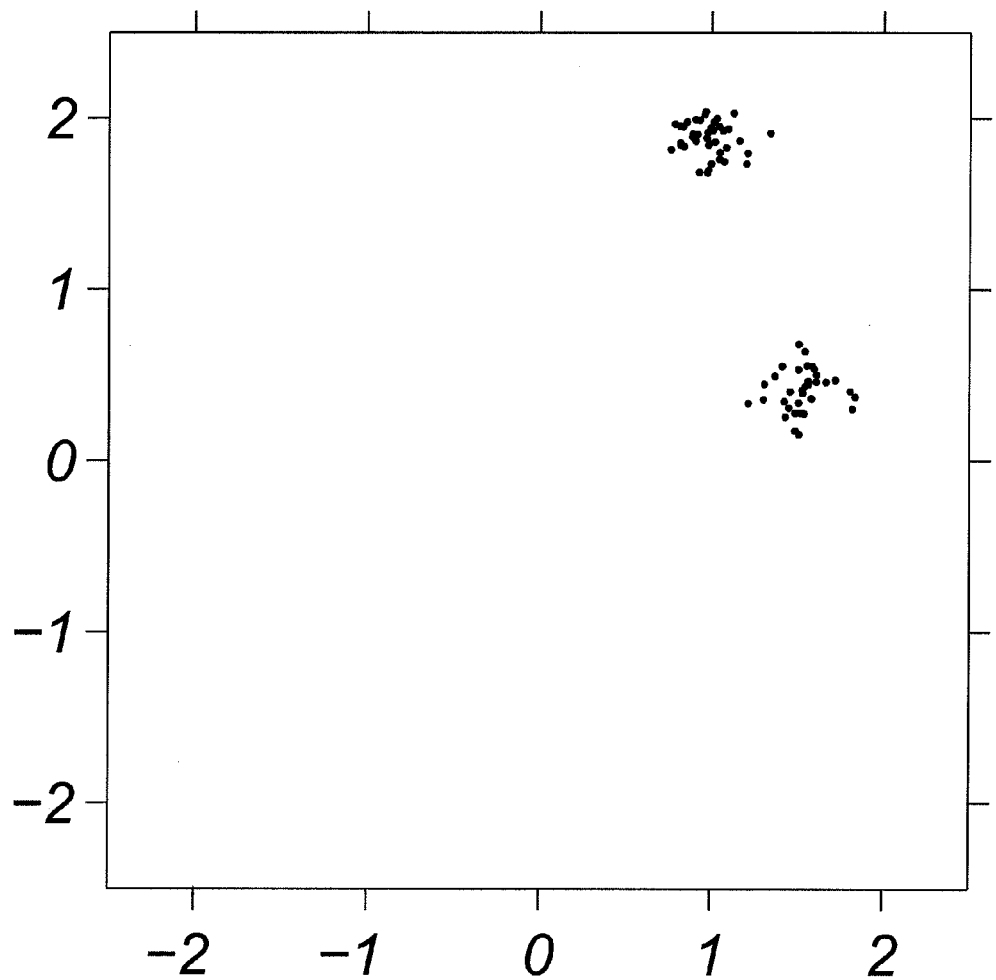
FIGS. 21a and 21b show the effect of the orthant K-means algorithm, where
Figure 21B:
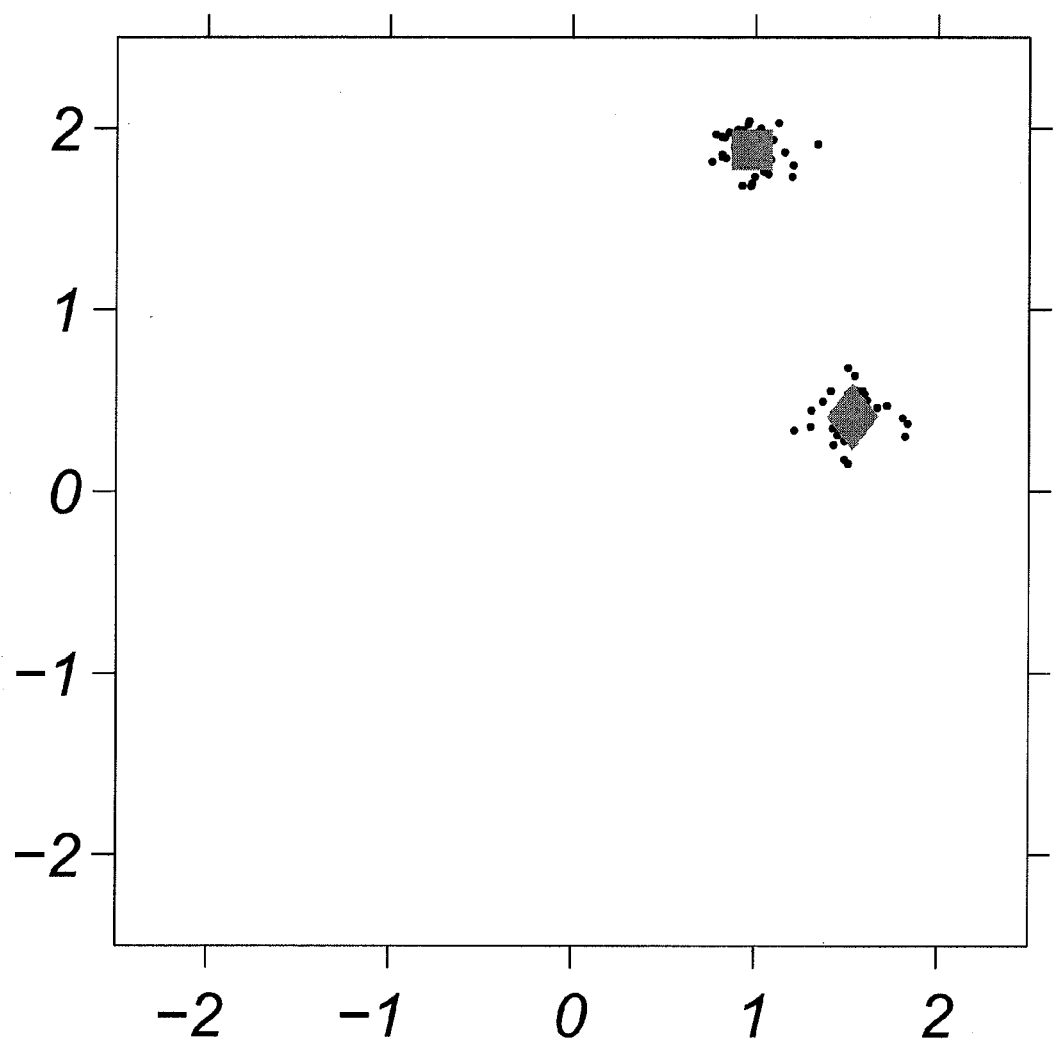

The centers of each of these clusters in $\mathbb{P}^2$, which are exhibited by a square and diamond respectively in FIG. 21b, can then be used as the radius vectors $\bar{\alpha}^1$ and $\bar{\alpha}^2$ of two perfect 2-hypercubes. The full codebooks $\kappa(\bar{\alpha}^1)$ and $\kappa(\bar{\alpha}^2)$, which are thereby implicitly specified, are exhibited in FIG. 22b. It is evident there that some hypercube vertices are effectively unused as code points. But this is no matter, as the distortion achieved is nevertheless quite low, and the use of the perfect hypercube technique has the great efficiencies of memory and computation requirements previously discussed.

This insight is formalized in the orthant K-means algorithm, which is a part of this invention, and which is described in detail in FIG. 23. The transformed training data u $\subset \mathbb{R}^D$ are mapped via the function p to the positive orthant $\mathbb{P}^D$, yielding $u_+$. $u_+$ is referred to as folded data, because the effect of the map p in $\mathbb{R}^2$ can be obtained by folding, in quarters along the coordinate axes, a paper graph of the plotted points of u. The folded data are then processed to find K clusters, by an iterative technique akin to the one found in a conventional K-means algorithm. The key difference between the conventional version and the orthant version is that in the latter, the search proceeds in $\mathbb{P}^D$ exclusively, and yields only K radius vectors $\bar{\alpha}^1, \ldots, \bar{\alpha}^K$. These radius vectors then implicitly define the desired K·$2^D$ code points, which by construction must lie on perfect D-hypercube vertices.

Note that obtaining K·$2^D$ code points via a conventional K-means algorithm would require maintaining, and iteratively updating, a set of K·$2^D$ candidate code points; the asymptotic cost is O(U·D·$2^D$·K) operations. By comparison the orthant K-means algorithm, likewise generating a codebook of K·$2^D$ implicit code points, has an asymptotic cost of just O(U·D·K) operations. As before we examine the ratio of costs of the algorithms being compared, in this case (cost of conventional K-means algorithm )/(cost of orthant K-means algorithm).

This ratio is $(U \cdot D \cdot 2^D \cdot K)/(U \cdot D \cdot K)$, and so we see that the orthant K-means algorithm is exponentially more efficient than its conventional counterpart. A similar argument applies to the comparative-memory requirements of the two algorithms. Hence, the orthant K-means algorithm will run substantially faster than its conventional counterpart. This is a significant advantage in adaptive, dynamic applications of the invention, wherein the recomputation of the implicit codebook must occur in real time.

Moreover, the orthant K-means algorithm is inherently efficient, insofar as for fixed K and U, it generates $O(2^D)$ implicit code points, at a cost that is only logarithmic (with respect to D) in the effective size of the codebook.

The effect of applying both the conventional and orthant K-means algorithms, to generate 8 code points in both cases, is exhibited in FIGS. 20*a*, 20*b*; 21*a*, 21*b*; and 22*a*, 22*b*.

FIGS. 20*a* and 20*b* show the effect of a conventional K-means algorithm, where FIG. 20*a* shows transformed example data u, and FIG. 20*b* shows a result of the conventional K-means algorithm, for K=8.

FIGS. 21*a* and 21*b* show the effect of the orthant K-means algorithm, where FIG. 21*a* shows folded example data, $u^+=p^{[u]}$, and FIG. 21*b* shows the result of the orthant K-means algorithm, for K=2 (the markers correspond to the α vectors of the desired K hypercubes).

Figure 22A:
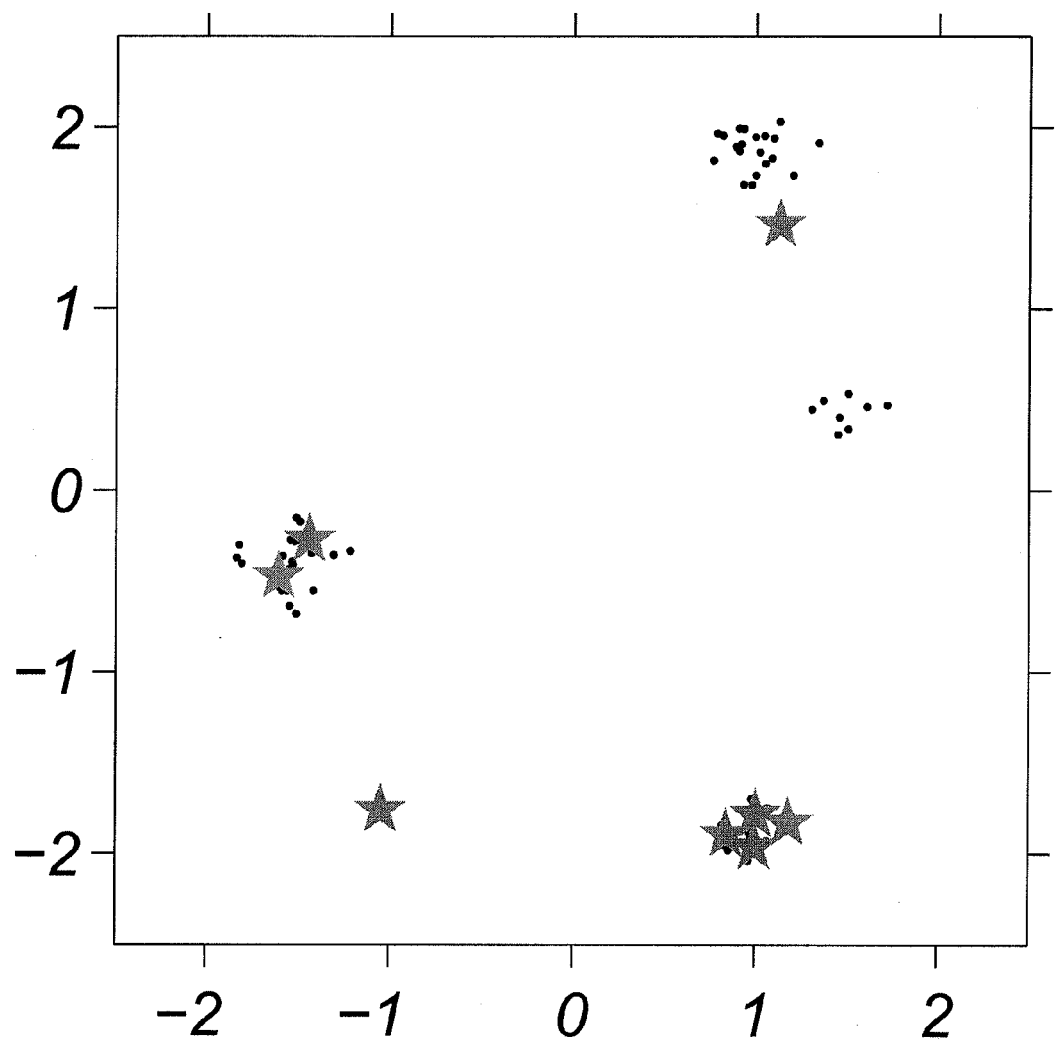
FIGS. 22a and 22b show a comparison of conventional and orthant K-means, where
Figure 22B:
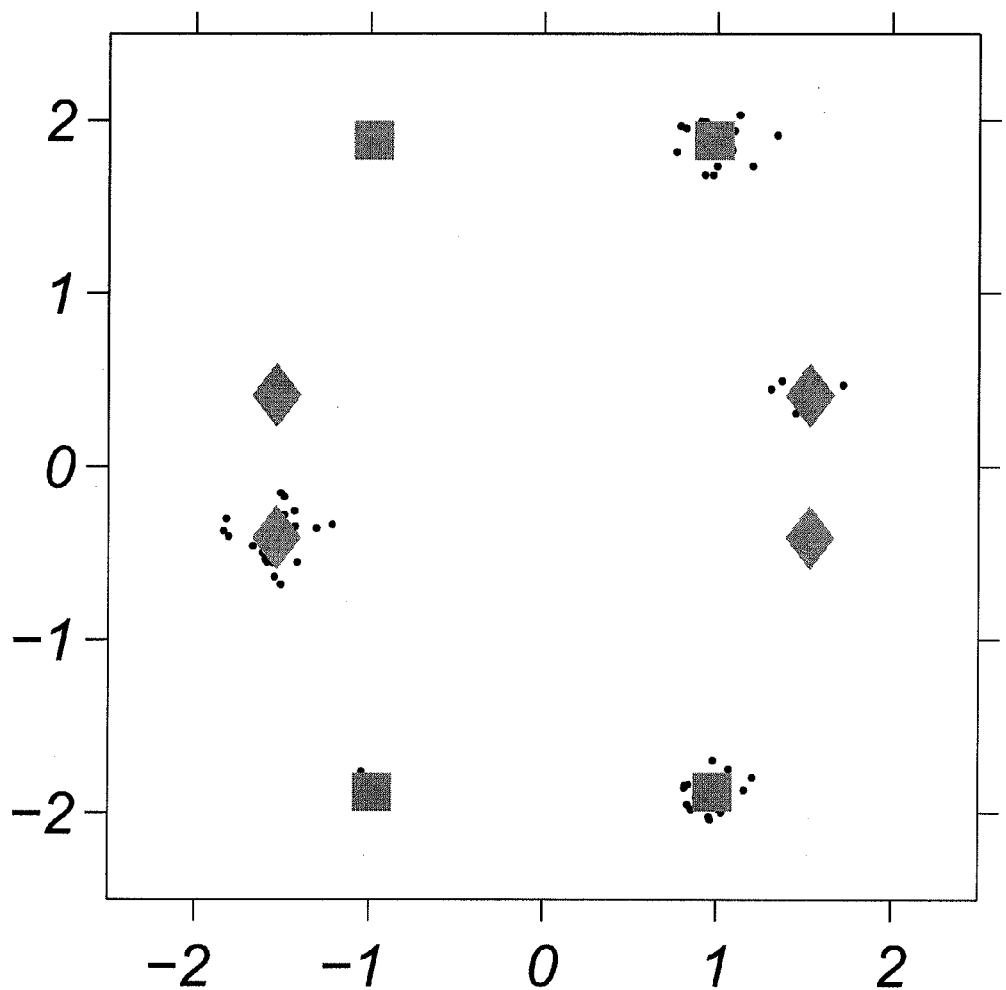

FIGS. 22*a* and 22*b* show a comparison of conventional K-means and orthant K-means, where FIG. 22*a* shows code points from conventional K-means, and FIG. 22*b* shows code points from orthant K-means. Note that the points in FIG. 22*b* lie on 2-hypercube vertices; those in FIG. 22*a* do not.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

The invention claimed is:

1. A computer-implemented method for data compression comprising the steps of:
   establishing an implicit codebook comprising an implicitly defined set of vectors, hereafter called code points, which are symmetrically placed with respect to the origin; said code points implicitly represented by a hypercube radius vector $\bar{\alpha}=<\alpha_1,\alpha_2, \ldots ,\alpha_D>$, wherein said code points are used for representing information elements; said information elements constituting data to be compressed, and said information elements also being vectors; and
   computing a compression function for said information elements by:
      inspecting the signs of said information elements to determine in which orthant said information element lies, thereby determining the implicit code point of the implicit codebook to represent said information element; and
      determining an index of the associated implicit code point so selected for said information element; and
   compressing said information elements by application of said compression function.

2. The method of claim 1, further comprising the steps of:
   compressing digitized human speech;
   transmitting said compressed, digitized human speech through a communication channel;
   receiving said compressed, digitized human speech via said communication channel;
   decompressing said compressed, digitized human speech; and
   processing said digitized human speech with an automatic speech recognition system.

3. The method of claim 1, further comprising the step of:
   applying an invertible function to information elements to be compressed, said function determined so that an aggregate of typical data to be compressed will approximate a uniform distribution within a *D*-dimensional sphere, centered at the origin.

4. The method of claim 3, further comprising the step of:
   finding a symmetrizing transform.

5. The method of claim 4 for compressing a vector v, further comprising the steps of:
   obtaining a vector v for compression;
   computing u=Tv, where u is denoted $<u_1, u_2, \ldots, u_D>$; where T is the symmetrizing transform;
   forming a D-bit binary number i as a bitwise concatenation $i=m(u_D)m(u_{D-1}) \ldots m(u_2)m(u_1)$; where the jth bit of i is 0 if $u_j$ is zero or positive, and 1 if it is negative; and
   transmitting i.

6. The method of claim 4 for decompressing an index i, obtained via compression with respect to the hypercube radius vector $\bar{\alpha}=<\alpha_1,\alpha_2, \ldots ,\alpha_D>$, further comprising the steps of:
   obtaining an index i for decompression;
   setting $$\tilde{u}_1 = b_0(i, \alpha_1)$$
$$\tilde{u}_2 = b_1(i, \alpha_2)$$
$$\vdots$$
$$\tilde{u}_D = b_{D-1}(i, \alpha_D)$$

where each $\tilde{u}_j$ is either $+\alpha_j$ or $-\alpha_j$ depending as the jth bit of i is 0 or 1;
   computing $\tilde{v}=T^{-1}\tilde{u}$; and
   returning $\tilde{v}$.

7. The method of claim 3, further comprising the step of:
   finding an optimal *D*-hypercube codebook, with respect to typical transformed data.

8. The method of claim 7, said symmetrizing transform further comprising a whitening transform.

9. The method of claim 8, further comprising the steps of:
   projecting all data into a *D*-1-dimensional space;
   processing a resulting data set; and
   wherein only *D*-1 bits are transmitted for each vector processed.

10. The method of claim 8, further comprising the step of:
    representing the whitening transform in a memory efficient manner as the product of a diagonal matrix, said matrix represented by only its *D* non-zero elements, and an orthogonal matrix; the inverse of this transform therefore obtainable as the product, in the opposite order, of a diagonal matrix of *D* reciprocals of the original *D* non-zero elements, and the transpose of the original orthogonal matrix.

11. The method of claim 7, further comprising the steps of:
    determining an optimal hypercube radius vector $\bar{\alpha}=<\alpha_1,\alpha_2,\ldots,\alpha_D>$, this vector defining said hypercube codebook, that yields minimal mean square coding distortion among all D-hypercube codebooks, for typical data to be compressed.

12. The method of claim 11, further comprising the step of:
computing an optimal hypercube radius vector $\overline{\alpha}=<\alpha_1, \alpha_2, \ldots, \alpha_D>$, from an example data collection $E$ comprised of $E=|\epsilon|$ typical data vectors $v$, by computing for each dimension $i=1, \ldots, D$ the quantity $$\alpha_i = \frac{1}{E} \sum_v |v_i|$$

where the sum is taken to run over every vector $v$ in $\epsilon$.

13. The method of claim 7, further comprising the step of:
determining an optimal hypercube radius vector $\overline{\alpha}=<\alpha_1, \alpha_2, \ldots, \alpha_D>$, this vector defining said hypercube codebook, that yields minimal mean square coding distortion among all D-hypercube codebooks, with respect to typical transformed data.

14. The method of claim 13, further comprising the step of:
computing an optimal hypercube radius vector $\overline{\alpha}=<\alpha_1, \alpha_2, \ldots, \alpha_D>$, from an example data collection $\epsilon$ comprised of $E=|\epsilon|$ typical data vectors $v$, to which has been applied the symmetrizing function of claim 3, to yield a collection $U$ comprised of $U=|U|=|\epsilon|=E$ typical data vectors $u$, by computing for each dimension $i=1, \ldots, D$ the quantity $$\alpha_i = \frac{1}{U} \sum_u |u_i|$$

where the sum is taken to run over every vector $u$ in $U$.

15. The compression method of claim 3, further comprising the step of:
incorporating a rotation in the symmetrizing transform, or equivalently rotating the hypercube codebook, to lower distortion.

16. The method of claim 15, further comprising the step of:
finding an optimal hypercube radius vector for the rotated hypercube codebook.

17. The method of claim 1, further comprising the step of:
finding an optimal $D$-hypercube codebook.

18. The method of claim 1 for compressing a vector $v=<v_1, v_2, \ldots, v_D>$, further comprising the steps of:
obtaining a vector $v=<v_1, v_2, \ldots, v_D>$ for compression;
forming a $D$-bit binary number $i$ as a bitwise concatenation
$i=m(v_D)m(v_{D-1}) \ldots m(v_2)m(v_1)$; where the $j$th bit of $i$ is 0 if $-v_j$ is zero or positive, and 1 if it is negative; and transmitting $i$.

19. The method of claim 1 for decompressing an index $i$, obtained via compression with respect to the hypercube radius vector $\overline{\alpha}=<\alpha_1, \alpha_2, \ldots, \alpha_D>$, further comprising the steps of:
obtaining an index $i$ for decompression;
setting $$\tilde{u}_1 = b_0(i, \alpha_1)$$
$$\tilde{u}_2 = b_1(i, \alpha_2)$$
$$\vdots$$
$$\tilde{u}_D = b_{D-1}(i, \alpha_D)$$

where each $\tilde{u}_j$ is either $+\alpha_j$ or $-\alpha_j$ depending as the $j$th bit of $i$ is 0 or 1;
and returning $\tilde{u}$, the vector comprised of elements $u_1, u_2, \ldots, u_D$, computed as above.

20. The compression method of claim 1, further comprising the steps of:
increasing a number of implicit code points by increasing the number of hypercubes, wherein compression occurs with respect to a family of hypercube codebooks.

21. The compression method of claim 20, using a family of hypercubes $A$, each hypercube determined by its associated hypercube radius vector $\overline{\alpha}=<\alpha_1, \alpha_2, \ldots, \alpha_D>$, further comprising the steps of:
applying a symmetrizing transform $T$, obtaining $u=Tv$, said symmetrizing transform comprising the steps of:
given vector $v$ to compress find $u=Tv$;
finding the orthant of $u$, encoded as $i=m(u_D)m(u_{D-1}) \ldots m(u_1)$;
finding, via explicit search within the orthant, a hypercube index $k$ of the closest hypercube $\overline{\alpha}^k \in A$; and
transmitting a result of said search, in the form of the said hypercube index $k$ so determined, along with the identity $i$ of the orthant, to a receiver.

22. The method of claim 21, using a multiplicity of hypercubes $A$; varying with respect to one another in hypercube radius vector, in orientation, or both; said orientations being expressed by a rotation $R^k$ associated to each hypercube radius vector $\overline{\alpha}^k$, said rotation possibly being the identity; and further comprising the steps of: given vector $v$ to compress
finding each $u^k = R^k Tv$,
finding the orthant index $i$ of $u^k$
finding, via explicit search within the associated orthant, a hypercube index $k$ of the closest rotated hypercube
transmitting a result of said search, in the form of the said hypercube index $k$ so determined, along with the identity $i$ of the orthant, to a receiver.

23. The method of claim 21, further comprising the steps of:
decompressing the pair comprised of hypercube index $k$ and orthant index $i$; by using hypercube index $k$ to select an appropriate hypercube radius vector $\overline{\alpha}^k$; and
inspecting the coded orthant $i$ to yield an appropriate vertex of the $\overline{\alpha}^k$ hypercube;
wherein said vertex is taken as $\overline{\alpha}^k$, from which $\tilde{v}=T^{-1}\tilde{u}$ is computed, and the value $\tilde{v}$ returned as the result.

24. The method of claim 22, further comprising the steps of:
decompressing the pair comprised of hypercube index $k$ and orthant index $i$; by using hypercube index $k$ to select an appropriate hypercube radius vector $\overline{\alpha}^k$; and
inspecting the coded orthant $i$ to yield an appropriate vertex of the $\overline{\alpha}^k$ hypercube;
wherein said vertex is taken as $\tilde{u}_1$, from which $\tilde{v}=T^{-1}(R^k)^{-1}\tilde{u}$ is computed, and the value $\tilde{v}$ returned as the result.

25. A computer-implemented method to find a collection $A$ of perfect hypercube codebooks, comprising the steps of:
applying an orthant K-means algorithm to find a collection of $K$ perfect hypercube codebooks that yield low average coding distortion for transformed example data;
increasing a number of implicit code points by increasing the number of hypercubes; and
compressing source data with minimal coding distortion by coding transformed source data using at least one code point selected from said increased number of implicit code points.

26. A computer-implemented compression method, comprising the steps of:
- obtaining a vector v for compression, said vector v comprising at least one information element to be compressed;
- computing u=Tv, where u is denoted by $<u_1, u_2, \ldots, u_D>$;
- forming $\bar{\zeta}(u)=<\zeta(u_1), \ldots, \zeta(u_D)>$;
- finding $k=k=\mathrm{argmin}_j\|u-\bar{\alpha}^j\odot\bar{\zeta}(u)\|$, where $\bar{\alpha}^j$ is drawn from a set of hypercube radius vectors $A=\{\bar{\alpha}^1, \bar{\alpha}^2, \ldots, \bar{\alpha}^K\}$; wherein $\bar{\alpha}^j\odot\bar{\zeta}(u)$ is the element of $K(\bar{\alpha}^j)$ that lies in the same orthant as u, and wherein k is the index of a hypercube codebook that has a vertex closest to u;
- forming the D-bit binary number i as the bitwise concatenation $i=m(u_D)m(u_{D-1}) \ldots m(u_2)m(u_1)$, where the j th bit of i is 0 if $u_j$ is zero or positive, and is 1 if it is negative; and
- transmitting the pair $<k-1,i>$, said pair comprising a code representing said at least one information element to be compressed.

27. A computer-implemented decompression method, comprising the steps of:
- obtaining the pair $<k-1,i>$ for decompression, said pair comprising a code representing at least one compressed information element;
- selecting $\bar{\alpha}^k=<\alpha_1^k, \alpha_2^k, \ldots, \alpha_D^k>$ from the set of hypercube radius vectors $A=\{\bar{\alpha}^1, \bar{\alpha}^2, \ldots, \bar{\alpha}^K\}$;
- setting $$\tilde{u}_1 = b_0(i, \alpha_1^k)$$
$$\tilde{u}_2 = b_1(i, \alpha_2^k)$$
$$\vdots$$
$$\tilde{u}_D = b_{D-1}(i, \alpha_D^k),$$

where $\tilde{u}_j$ is either $+\alpha_j^k$ or $-\alpha_j^k$, depending as whether the jth bit of i is 0 or 1;
- computing $\tilde{v}=T^{-1}\tilde{u}$; and
- returning $\tilde{v}$, wherein $\tilde{v}$. comprises said at least one compressed information element decompressed.

28. A computer-implemented method for finding a family A of K hypercube codebooks, comprising the steps of:
- beginning with a fixed number K of desired hypercubes, and an example dataset U:
  - mapping each element $u\in U$ where $u=<u_1, \ldots, u_D>$, to the positive orthant $\mathbb{P}^D$, via the map $p: <u_1, \ldots, u_D> \to <|u_1|,|u_2|, \ldots, |u_D|>$, yielding the set $U^+=\{p(u)|u\in U\}$;
- selecting an initial set of K radius vectors $A^{(0)}=\{\bar{\alpha}_0^{(0)} \ldots \bar{\alpha}_{K-1}^{(0)}\}$;
- setting an iteration count i to 0;
- establishing a termination condition $\tau$, which depends upon one or more of:
  - the number of iterations executed;
  - the closeness of match between a current radius vector collection $A^{(i)}$ and $U^+$; and
  - the improvement of a statistic over a previous iteration, wherein said dependence is expressed as $\tau(i, A^{(i)}, U^+)$;
- testing $\tau(i, A^{(i)}, U^+)$; and
- if the termination condition is not satisfied, computing a new radius vector collection $A^{(i+1)}$ as follows:
  - partitioning $U^+$ into K sets $S_0 \ldots S_{K-1}$, where $$S_j = \{v \in u^+ \mid \mathrm{argmin}_k \|v - \bar{\alpha}_k^{(i)}\| = j\}$$

where $S_j$ comprises all the vectors v in $U^+$ that are closer to $\bar{\alpha}_j^{(i)}$ than any other element of $A^{(i)}$;
  - setting $\bar{\alpha}_j^{(i+1)}$, the j th entry of the new radius vector collection $A^{(i+1)}$, to the mean of the vectors in $S_j$, which is in symbols $$\bar{\alpha}_j^{(i+1)} = \frac{1}{|S_j|}\sum_{v \in S_j} v; \text{ and setting } A^{(i+1)} = \{\bar{\alpha}_0^{(i+1)} \ldots \bar{\alpha}_{K-1}^{(i+1)}\};$$

- incrementing the iteration count i; and
  - returning to said testing step;
- else, if the termination condition is satisfied, stopping and returning $A^{(i)}$ as the desired family A of K hypercube codebooks that yield low average coding distortion for transformed example data.

29. A computer-implemented method for data compression, comprising the steps of:
- computing a compression function for information elements by:
  - inspecting the signs of said information elements to determine in which quadrant of an implicit codebook a corresponding implicit code point lies;
  - determining an index of an associated implicit code point for said information element; and
  - compressing at least one information element by applying said compression function to said at least one information element.

30. The method of claim 29, further comprising the step of:
- compressing vectors arising from a data source by first applying a symmetrizing transform, and then compressing the transformed vectors.

31. The method of claim 30, further comprising the step of incorporating a rotation in the symmetrizing transform, or equivalently rotating the hypercube codebook, to lower distortion, and then compressing.

32. The method of claim 30, further comprising the step of: increasing a number of code points by increasing the number of hypercubes, wherein compression occurs with respect to a family of hypercube codebooks, and the preferred hypercube is found by explicit search, once the orthant of the vector to be compressed has been determined.

33. The method of claim 30, further comprising the step of: increasing a number of code points by increasing the number of hypercubes, wherein compression occurs with respect to a family A of hypercube codebooks, the hypercubes varying with respect to one another in hypercube radius vector, in orientation, or both; the selected hypercube and orthant index being found by explicit search among a set consisting of the preferred vertex of each hypercube, the preferred vertex of each hypercube being the one that lies in the same orthant of the vector to be compressed, for each hypercube.

34. The method of claim 29, further comprising the steps of:
- rotating said hypercube codebook, or equivalently rotating the data to be compressed, to lower distortion and then compressing the transformed vectors by the method of claim 24.

35. The method of claim 29, further comprising the step of:
establishing an implicit codebook comprising an implicitly defined set of vectors, hereafter called code points, which are symmetrically placed with respect to the origin; wherein said code points are used for representing information elements.

36. The method of claim 29, further comprising the step of:
increasing a number of code points by increasing the number of hypercubes, wherein compression occurs with respect to a family of hypercube codebooks, and the preferred hypercube is found by explicit search, once the orthant of the vector to be compressed has been determined.

37. The method of claim 29, further comprising the step of:
increasing a number of code points by increasing the number of hypercubes, wherein compression occurs with respect to a family A of hypercube codebooks, the hypercubes varying with respect to one another in hypercube radius vector, in orientation, or both; the selected hypercube and orthant index being found by explicit search among a set consisting of the preferred vertex of each hypercube, the preferred vertex of each hypercube being the one that lies in the same orthant of the vector to be compressed, for each hypercube.

\* \* \* \* \*